United States Patent
Suzuki

(10) Patent No.: US 10,564,634 B2
(45) Date of Patent: Feb. 18, 2020

(54) METHOD FOR SETTING MOUNTING POSITION OF TARGET SUBSTRATE AND FILM FORMING SYSTEM

(71) Applicant: TOKYO ELECTRON LIMITED, Tokyo (JP)

(72) Inventor: Yasunobu Suzuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 99 days.

(21) Appl. No.: 15/626,632

(22) Filed: Jun. 19, 2017

(65) Prior Publication Data

US 2017/0364061 A1    Dec. 21, 2017

(30) Foreign Application Priority Data

Jun. 20, 2016 (JP) .................. 2016-121850

(51) Int. Cl.
  C23C 16/04 (2006.01)
  G05B 19/418 (2006.01)
  C23C 16/52 (2006.01)
  C23C 16/458 (2006.01)

(52) U.S. Cl.
  CPC ........ G05B 19/4189 (2013.01); C23C 16/042 (2013.01); C23C 16/4585 (2013.01); C23C 16/52 (2013.01); G05B 2219/45031 (2013.01)

(58) Field of Classification Search
  None
  See application file for complete search history.

(56) References Cited

U.S. PATENT DOCUMENTS

| | | | |
|---|---|---|---|
| 2003/0003608 A1* | 1/2003 | Arikado | H01L 23/544 438/14 |
| 2005/0246915 A1* | 11/2005 | Lu | H01L 21/68 33/645 |
| 2006/0144335 A1* | 7/2006 | Lee | C23C 14/505 118/719 |
| 2009/0032190 A1* | 2/2009 | Takahashi | H01J 37/32091 156/345.33 |

(Continued)

FOREIGN PATENT DOCUMENTS

| | | |
|---|---|---|
| JP | 2002-118162 A | 4/2002 |
| JP | 2008-306162 | 12/2008 |

(Continued)

Primary Examiner — Bernard G Lindsay
(74) Attorney, Agent, or Firm — Fenwick & West LLP

(57) ABSTRACT

In a method for setting a mounting position of a target substrate, the test substrate is transferred to a second position deviated from a first position. A mask has expected arrangement position where a non-film formation region has a preset width when the target substrate is mounted at the first position and subjected to a film formation. The film is formed on the test substrate at the second position by using the mask. Width of the non-film formation region formed on the test substrate after the film formation is measured. Actual arrangement position of the mask is specified based on a direction and a distance of the deviation of the second position from the first position and the measured width of the non-film formation region. The first position is corrected such that the non-film formation region has the preset width based on the actual arrangement position of the mask.

10 Claims, 16 Drawing Sheets

(56) References Cited

U.S. PATENT DOCUMENTS

| | | | |
|---|---|---|---|
| 2009/0087542 A1* | 4/2009 | Sasaki | C23C 16/04 |
| | | | 427/8 |
| 2009/0229519 A1* | 9/2009 | Saitoh | C23C 16/325 |
| | | | 118/722 |
| 2010/0080444 A1 | 4/2010 | Yamaguchi et al. | |
| 2012/0046904 A1* | 2/2012 | Hayashi | H01L 21/681 |
| | | | 702/150 |
| 2014/0036274 A1* | 2/2014 | Marquardt | G01B 11/14 |
| | | | 356/614 |

FOREIGN PATENT DOCUMENTS

| | | |
|---|---|---|
| JP | 2012-186226 A | 9/2012 |
| KR | 1026006 B1 | 3/2011 |

\* cited by examiner

DISTANCE BETWEEN $C_R$ AND $C_W$: L $$\Delta T_X = \Delta T \cdot \frac{\Delta x}{L}$$

$$\Delta T_Y = \Delta T \cdot \frac{\Delta y}{L}$$

METHOD FOR SETTING MOUNTING POSITION OF TARGET SUBSTRATE AND FILM FORMING SYSTEM

CROSS-REFERENCE TO RELATED APPLICATIONS

This application claims priority to Japanese Patent Application No. 2016-121850 filed on Jun. 20, 2016, the entire contents of which is incorporated herein by reference.

FIELD OF THE INVENTION

The disclosure relates to a technique for mounting a target substrate on a mounting table installed in a film forming apparatus.

BACKGROUND OF THE INVENTION

In manufacturing electronic devices, various processes are performed on a semiconductor wafer (hereinafter, simply referred to as "wafer") as a target substrate. For example, when a film forming process is performed on a surface of a wafer, there is used a film forming system including a film forming apparatus for performing film formation, a transfer unit for loading/unloading a wafer into/from the film forming apparatus, and the like.

The transfer unit of the film forming system needs to accurately transfer the wafer to a preset mounting position (e.g., a mounting table to be described later) in the film forming apparatus. In this regard, Japanese Patent Application Publication No. 2008-306162, for example, discloses a technique for obtaining "positional deviation information" of a wafer supported by supporting arms based on an image of the wafer which is captured by a CCD (Charge-Coupled Device) camera having an imaging device and provided near an inlet of a processing unit capable of performing film formation or the like and then correcting a destination of the wafer by the supporting arms.

In the film forming apparatus, a non-film formation region (region where film formation is not performed) may be formed at an edge portion of the wafer in order to prevent an end effector of the transfer unit from being contaminated due to film formation on a backside of the wafer. In the case of forming the non-film formation region at the wafer, a film formation region is formed at an inner side of the non-film formation region.

However, a technique for forming the non-film formation region at the edge portion of the wafer is not disclosed in Japanese Patent Application Publication No. 2008-306162. Therefore, when the non-film formation region is formed at an incorrect position of the edge portion of the wafer, the positional deviation of the non-film formation region cannot be corrected regardless of the correction of the destination of the wafer based on the imaging result of the CCD camera.

In the film forming system, a multilayer film may be formed on the wafer by performing film formation by using a plurality of film forming apparatuses. In that case, if the non-film formation region is formed at an incorrect position in the respective film forming apparatuses, films having misaligned film forming positions are laminated. Accordingly, it is not possible to form a multilayer film having good characteristics.

SUMMARY OF THE INVENTION

In view of the above, the disclosure provides a method for determining a mounting position of a target substrate which is capable of forming a film formation region or a non-film formation region at incorrect positions of the target substrate, and a film forming system.

In accordance with an aspect, there is provided a method for setting a mounting position of a target substrate transferred by a substrate transfer unit on a mounting table in a processing chamber of a film forming apparatus, wherein the film forming apparatus includes a ring-shaped mask which covers a surface of an edge portion of the target substrate mounted on the mounting table and subjected to film formation to form a non-film formation region at the edge portion and has an opening corresponding to a film formation region formed at an inner side of the non-film formation region, the mask having an expected arrangement position where the non-film formation region has a preset width when the target substrate is mounted at a first position on the mounting table and subjected to the film formation.

The method includes: transferring a test substrate by the substrate transfer unit to a second position on the mounting table which is set to be deviated from the first position by a preset distance in a preset direction; performing the film formation on the test substrate mounted at the second position by using the mask; measuring a width of the non-film formation region formed on the test substrate after the film formation; specifying an actual arrangement position of the mask based on the direction and the distance of the deviation of the second position from the first position and the measured width of the non-film formation region formed on the test substrate; and correcting the first position as the mounting position of the target substrate transferred by the substrate transfer unit such that the non-film formation region has the preset width based on the actual arrangement position of the mask.

In the present disclosure, the actual arrangement position of the mask is specified by allowing the film forming apparatus for forming the non-film formation region on the target substrate by using the mask to perform the film formation while intentionally deviating the mounting position of the test target substrate. As a result, the mounting position of the target substrate can be specified based on the actual arrangement position, which makes it possible to form the film-formation region and the non-film formation region at the accurate positions on the target substrate.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

A configuration of a film forming system 1 according to an embodiment, for forming a film on a wafer W as a target substrate, will be described with reference to FIGS. 1 to 7C.

Figure 1:
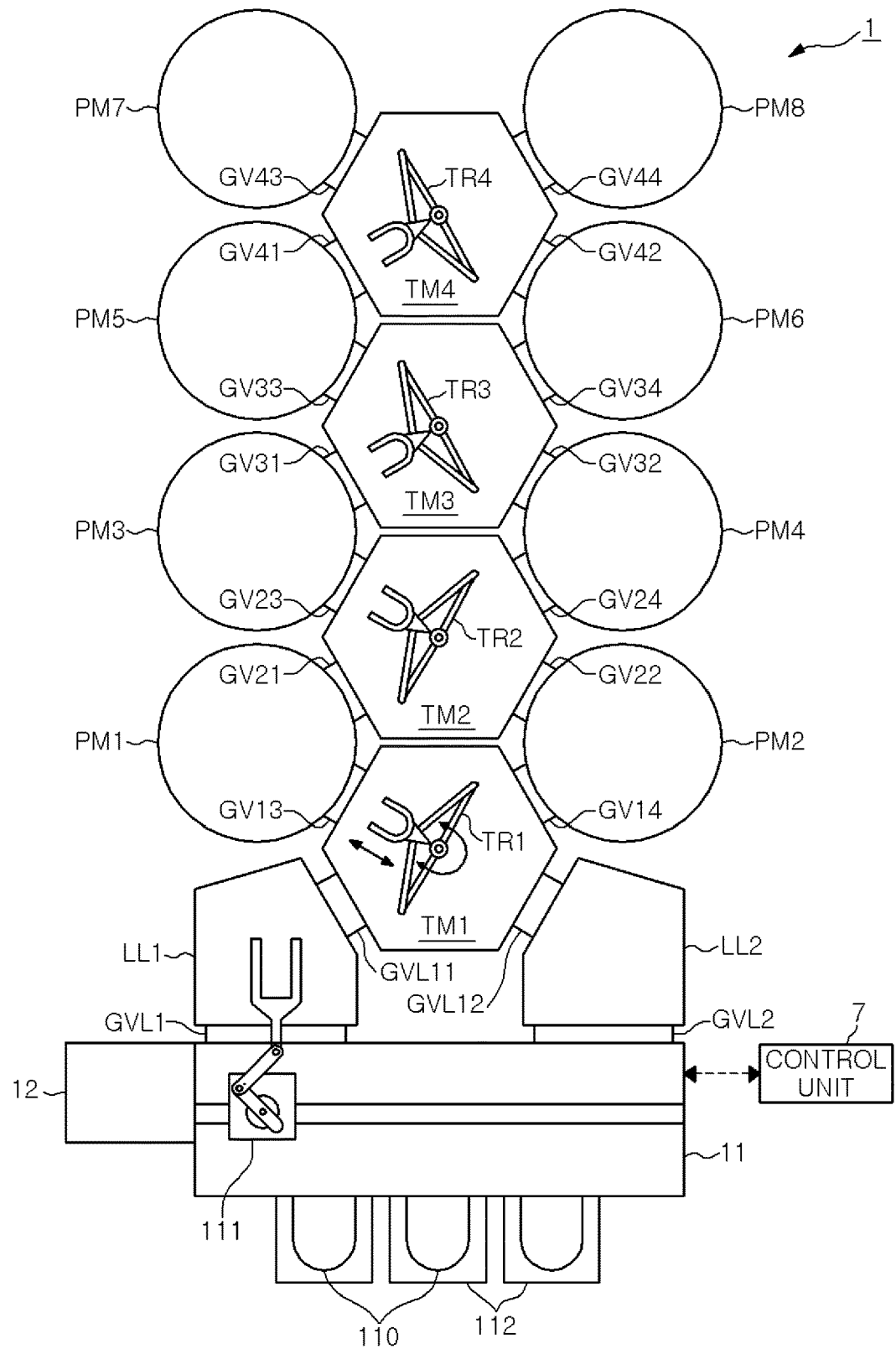
FIG. 1 is a top view of a film forming system according to an embodiment.

As shown in FIG. 1, the film forming system 1 of the present example includes a loader module 11 for transferring the wafer W under an atmospheric pressure atmosphere, an aligner 12 for aligning an orientation of the wafer W before film formation, load-lock modules LL1 and LL2 for switching an ambient atmosphere of the wafer W between an atmospheric pressure atmosphere and a vacuum pressure atmosphere, vacuum transfer modules TM1 to TM4 for transferring the wafer W under a vacuum pressure atmosphere, and process modules PM1 to PM8 for processing the wafer W.

The loader module 11 has a configuration in which a lower transfer unit 111 is provided in a case in an atmospheric pressure atmosphere. The loader transfer unit 111 is configured as a transfer robot. Further, the loader transfer unit 111 includes: a multi-joint arm; an end effector, attached to a leading end of the multi-joint arm, for transferring the wafer W; and a driving unit for driving the multi-joint arm.

A plurality of mounting stages 112, each being capable of mounting thereon a FOUP (Front Open Unified Pod) capable of accommodating a plurality of, e.g., 25, wafers is arranged along one side surface of the case of the loader module 11. Unprocessed or processed wafers W are accommodated in the FOUP 110 mounted on each of the mounting stages 112.

The loader transfer unit 111 in the loader module 11 transfers the wafer W between the FOUPs 110 mounted on the mounting stages 112, the aligner 12, and the load-lock modules LL1 and LL2.

The aligner 12 performs pre-alignment for aligning an orientation of the wafer W which is unloaded from the FOUP 110 to be transferred into the load-lock modules LL1 and LL2. The aligner 12 also has a function of obtaining image data of the edge portion of the wafer W after the film formation. The specific configuration and function of the aligner 12 will be described later with reference to FIGS. 4 to 7C.

Each of the load-lock modules LL1 and LL2 has an evacuable chamber. Further, the load-lock modules LL1 and LL2 are connected to the loader module 11 via gate valves GVL1 and GVL2, respectively. The chamber has therein a leakage valve (not shown) and a vacuum pump (not shown) for switching an inner atmosphere between an atmospheric pressure atmosphere and a vacuum pressure atmosphere. The load-lock modules LL1 and LL2 are also connected to a common vacuum transfer module TM1 via gate valves GV11 and GV12, respectively.

Since the vacuum transfer modules TM1 to TM4 have substantially the same configuration, the vacuum transfer module TM1 will be described representatively. As shown in FIG. 1, the vacuum transfer module TM1 has a configuration in which a transfer unit TR1 is provided in a chamber having, e.g., a hexagonal shape when seen from the top. The chamber of the vacuum transfer module TM1 is in an evacuated state and, thus, the wafer W loaded into the chamber is transferred under a vacuum pressure atmosphere.

The transfer unit TR1 is configured as a transfer robot. The transfer unit TR1 includes: a multi-joint arm configured to rotate about a vertical axis and extend and contract between an extended position spaced apart from the vertical axis in a horizontal direction and a contracted position close to the vertical axis; an end effector, attached to a leading end of the multi-joint arm, for transferring the wafer W; and a driving unit for driving the multi-joint arm.

As shown in FIG. 1, the vacuum transfer modules TM1 to TM4 including the above-described vacuum transfer module TM1 are arranged in a row in a front-rear direction when seen from the loader module 11 in a state where one side surfaces of the hexagonal chambers face toward the loader module 11.

The vacuum transfer module TM1 closest to the loader module 11 is connected to the load-lock modules LL1 and LL2 via the respective gate valves GV11 and GV12. The vacuum transfer module TM1 is also connected to the process modules PM1 and PM2 via respective gate valves GV13 and GV14. The gate valves GV13 and GV14 are provided at side surfaces of the chambers which are adjacent to the side surfaces connected to the load-lock modules LL1 and LL2.

The process modules PM1 and PM2 are connected to the common vacuum transfer module TM2 via gate valves GV21 and GV22, respectively.

In the same manner, the process modules PM3 to PM8 are connected to the vacuum transfer module TM2 and TM3 arranged in a row via corresponding gate valves GV23 and GV24, GV31 to GV34, and GV41 to GV44 (see FIG. 1).

Each of the process modules PM1 to PM8 has a processing apparatus for processing the wafer W. In the film forming system 1 of the present example, there will be described a case in which seven process modules PM1 to PM5, PM7 and PM8 are configured as film forming apparatuses for forming a metal film on a surface of the wafer W and one process module PM6 is configured as a heat treatment apparatus for performing heat treatment on the wafer W having the metal film on the surface thereof.

Whether the process modules PM1 to PM8 will be used as a film forming apparatus or another apparatus different from the film forming apparatus (e.g., a heat treatment apparatus or an oxidation apparatus for oxidizing a metal film) is determined depending on types of processing to be performed on the wafer W without any particular limit. All the process modules PM1 to PM8 may be configured as film forming apparatuses.

Next, the configuration of the film forming apparatus 2 corresponding to the process modules PM1 to PM5, PM7, and PM8 will be described with reference to FIG. 2. The film forming apparatus 2 of the present example is configured as a sputtering apparatus for forming a metal film on a surface of the wafer W.

Figure 2:
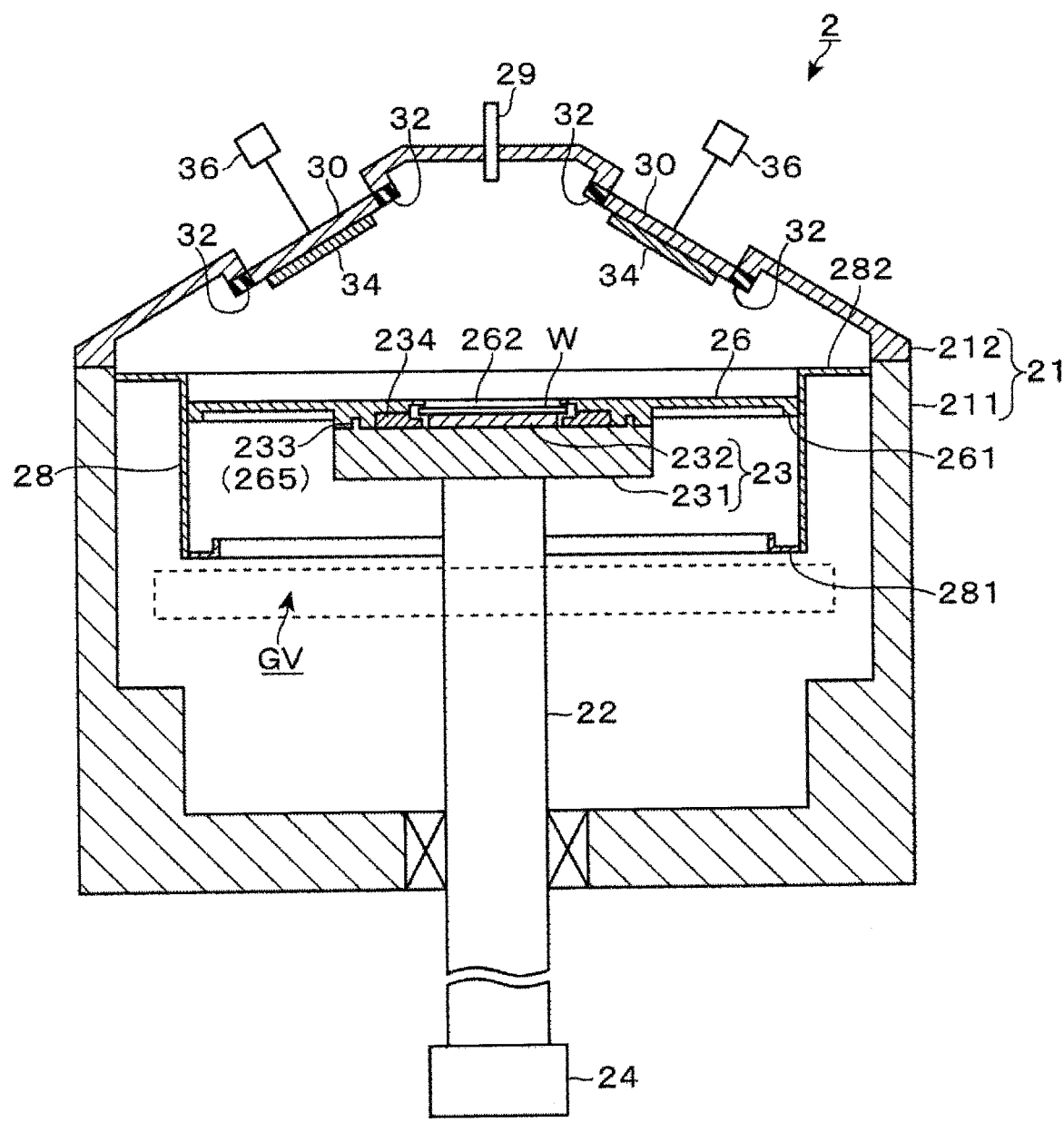
FIG. 2 is a vertical cross sectional side view of a film forming apparatus provided in the film forming system.

As shown in FIG. 2, the film forming apparatus 2 includes: a processing chamber 21; a mounting table 23, provided in the processing chamber 21, for mounting thereon a wafer W on which a film is to be formed; and a target 34 for sputtering metal toward the wafer W mounted on the mounting table 23.

For example, the processing chamber 21 has a main body 211 that is a substantially cylindrical container having an open top and a cover 212 for covering the opening of the main body 211. The gate valves GV13 and GV14, GV21 to GV24, GV31 to GV34 and GV41 to GV44 (indicated by a notation "GV" in FIG. 2) connected to the vacuum transfer modules TM1 to TM4 are provided at side surfaces of the main bodies 211. A vacuum exhaust unit (not shown) for evacuating the processing chamber 21 is connected to the main body 211.

Figure 3:
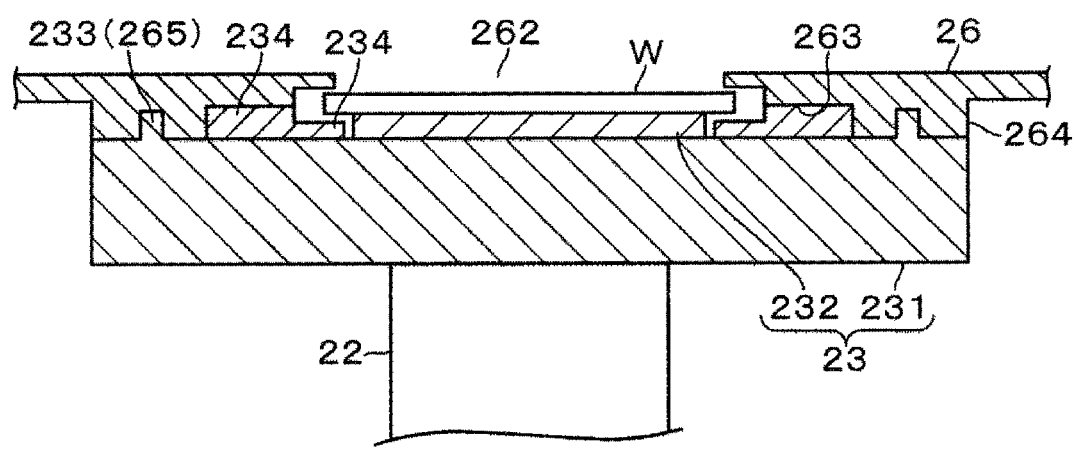
FIG. 3 is an enlarged vertical cross sectional side view of a mounting table provided in the film forming apparatus.

As shown in FIGS. 2 and 3, the mounting table 23 has a base 231, and an electrostatic chuck 232 for fixing the wafer W to the mounting table 23.

For example, the base 231 is a substantially disc-shaped member having a diameter greater than that of the wafer W and has on a top surface thereof the electrostatic chuck 232. For example, the electrostatic chuck 232 has a structure in which a chuck electrode (not shown) is embedded in a substantially disc-shaped ceramic layer having a diameter smaller than that of the wafer W. By starting or stopping supply of power from a DC power supply (not shown) to the chuck electrode in the electrostatic chuck 232, the attraction of the wafer W can be maintained or released. The disc-shaped base 231 and the electrostatic chuck 232 are arranged concentrically with the centers thereof.

A shield plate 234 for preventing the metal sputtered from the target 34 from being deposited on the surface of the base 231 is provided on the top surface of the mounting table 23. The shield plate 234 is a circular ring-shaped member having an opening capable of accommodating therein the electrostatic chuck 232. As shown in FIG. 3, the shield plate 234 is provided on the base 231 to surround the electrostatic chuck 232 in order to prevent the base 231 from being exposed through the opening 262 of a mask 26 to be described later.

A rotational shaft 22 for rotating the mounting table 23 about the vertical axis passing through the center of the mounting table 23 is connected to a central portion of a bottom surface of the base 231 of the mounting table 23. The rotational shaft 22 extends in a vertically downward direction from a connection portion with the base 231 and is connected to a driving unit 24 while penetrating through the bottom surface of the processing chamber 21 (main body 211). A seal mechanism for airtightly maintaining an inner space of the processing chamber 21 is provided at a position where the rotational shaft 22 penetrates through the main body 211.

The driving unit 24 rotates the rotational shaft 22 about the vertical axis, thereby rotating the wafer W mounted on the mounting table 23. The driving unit 24 also has a function of vertically moving the rotational shaft 22 to move the mounting table 23 between a delivery position where the wafer W is delivered with respect to the mounting table 23 at the time of loading the end effectors of the transfer units TR1 to TR4 into the processing chamber 21 and a film formation position where film formation is performed on the wafer W, the film formation position being set above the delivery position.

The mask 26 for forming a non-film forming region (region where no metal film is formed) at the edge portion of the wafer W is provided in the processing chamber 21.

The mask 26 is a circular ring-shaped member having a circular opening 262 having a diameter smaller than that of the wafer W and corresponding to a region where the metal film is formed. As shown in FIG. 3, a recess 263 capable of accommodating the electrostatic chuck 232, the shield plate 234 and the wafer W on the electrostatic chuck 232 is formed at a central portion of a bottom surface of the mask 26.

A circular ring-shaped protrusion 264 is formed around the recess 263. A plurality of insertion holes 265 is formed in a bottom surface of the protrusion 264 along a circumferential direction. On the top surface of the mounting table 23, a plurality of pins 233 is provided at positions corresponding to the insertion holes 265. By inserting the pins 233 into the insertion holes 265 of the mask 26, the mask 26 is fixed to the mounting table 23. It is also possible to provide the pins 233 at the mask 26 and form the insertion holes 265 into which the pins 233 are inserted at the mounting table 23.

An outer edge 261 of the mask 26 protrudes downward.

Provided in the processing chamber 21 is a mask support body 28 for separating the mask 26 from the mounting table 23 and supporting the separated mask 26 at the time of lowering the mounting table 23 to the delivery position and delivering the wafer W with respect to the transfer units TR1 to TR4. The mask support body 28 is a cylindrical member surrounding an outer peripheral surface of the mask 26 mounted on the mounting table 23. A flange 282 that is widened outwardly is provided at an upper end portion of the mask support body 28. The mask support body 28 is suspended in the processing chamber 21 while being fixed to an inner wall of the main body 211.

The mask support body 28 is disposed along a vertical direction in the cylindrical inner space to avoid interference with a path of movement of the mask 26 by the vertical movement of the mounting table 23. A supporting portion 281 protruding inwardly and having a hook-shaped vertical cross section is formed at a lower end portion of the mask support body 28 along a circumferential direction of the mask support body 28. Since the supporting portion 281 is provided above the delivery position, when the mounting table 23 is lowered to the delivery position, the outer edge 261 protruding downward is engaged with the supporting portion 281. As a consequence, the mask 26 is separated from the mounting table 23 and the wafer W is exposed.

Next, a configuration of a device provided at the cover 212 side will be described.

For example, a gas supply unit 29 for supplying a source gas (e.g., Ar gas) of ions for sputtering into the inner space of the processing chamber 21 is provided at a central portion of the cover 212.

The cover 212 is provided with a holder 30 for holding the target 34, and a holder supporting portion 32 for fixing the holder 30 to the cover 212. The holder supporting portion 32 is made of an insulator and fixes the holder 30 to the cover 212 while electrically insulating the holder 30 made of a metal from the cover 212 made of the same metal.

The holder 30 is connected to a power supply 36. When power is supplied from the power supply 36 to the holder 30, an electric field is generated near the target 34 held by the holder 30. Due to the electric field thus generated, the gas supplied from the gas supply unit 29 is dissociated and ions are generated. The ions collide with the target 34 and metal atoms are sputtered from the target 34. The metal sputtered from the target 34 is deposited on the wafer W through the opening 262 of the mask 26. Accordingly, a metal film is formed on the surface of the wafer W.

Figure 9:
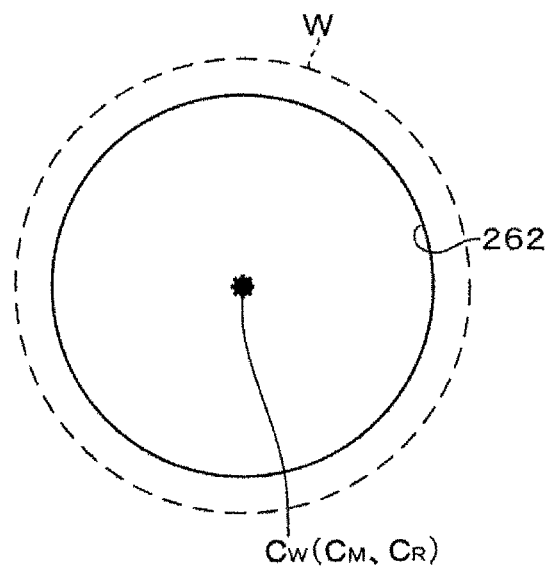
FIG. 9 is a top view of the wafer mounted on the mounting table with its center aligned with an opening of a mask.

In the film forming system 1 configured as described above, when the mask 26 is located at an expected arrangement position that is a design position, a center $C_M$ of a circle (indicated by a solid circle in FIGS. 9 to 18) of the opening 262 of the mask 26 and a rotational center $C_R$ (indicated by a dotted circle in FIGS. 9 to 17) of the mounting table 23 are aligned with each other, as can be seen from FIG. 9. In this state, a non-film formation region having a uniform width can be formed at the edge portion of the wafer W by arranging the wafer W such that a center $C_W$ (indicated by a cross mark in FIGS. 9 to 18) of the wafer W is aligned with the rotational center $C_R$ of the mounting table 23.

In order to form the non-film formation region at the correct position of the edge portion of the wafer W, the mask 26 of the present example is position-aligned by using the pins 233 provided at the mounting table 23 (or the base 231) as described above. A gap (space) needs to be ensured between each of the pins 233 and the corresponding insertion hole 265 so that the mask 26 can be attached to and detached from the mounting table 23 by the vertical movement of the mounting table 23 between the delivery position and the film formation position. As a result, the mask 26 may be deviated from the expected arrangement position on the mounting table 23 within the gap.

For example, when the mask 26 is manufactured or when the film forming system 1 is assembled, the position of the center $C_M$ of the opening 262 formed in the mask 26 or the position of the rotational center $C_R$ of the mounting table 23 may be deviated within a tolerable range.

Figure 10:
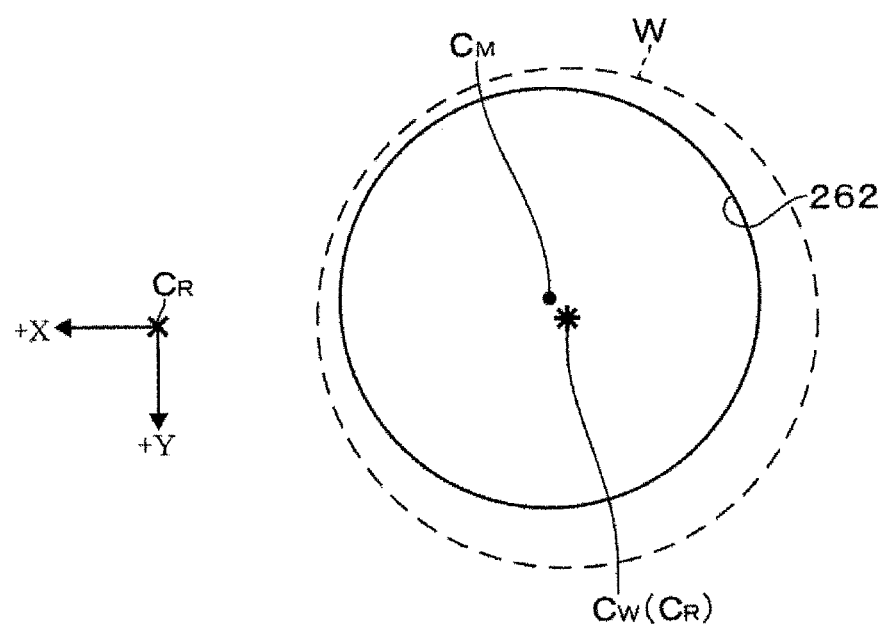
FIG. 10 is a top view of the wafer mounted on the mounting table with its center misaligned with the opening of the mask.

The width of the non-film formation region needs to be minimized in order to maximize a semiconductor device formation region. For example, when the width of the non-film formation region is 1.0 mm or less, the center $C_M$ of the opening 262 may be deviated from the center $C_W$ of the wafer W (i.e., the rotational center $C_R$ of the mounting table 23) beyond the tolerable range, as schematically shown in FIG. 10, due to combination of the effect of the gap between the pins 233 and the insertion holes 265 or the effect of errors in manufacturing or assembling devices related to the formation of the non-film formation region. As a result, the non-film formation region is formed at an incorrect position on the edge portion of the wafer W. If the film formation region reaches the edge of the wafer W, a metal film is formed even at the backside of the wafer W, which may lead to contamination of devices which contact with the backside.

For convenience of illustration, in FIGS. 4 to 7C and 9 to 18, a difference between the diameter of the wafer W and the diameter of the opening 262 of the mask 26 or a difference between the diameter of the wafer W and the diameter of the metal film ML (i.e., width of the non-film formation region EA) is illustrated in exaggeration.

Especially, the mask 26 is relatively frequently separated from the film forming apparatus 2 and subjected to cleaning or the like, compared to the mounting table 23 or the like. Therefore, the film forming system 1 may be operated while exchanging previously prepared a plurality of masks 26. In that case, a direction or a distance of the deviation of the center $C_M$ of the opening 262 from the center $C_W$ of the wafer W may vary whenever the masks 26 are exchanged.

In order to deal with the above drawback, the film forming system 1 of the present example is provided with an imaging unit 521 that captures an image of the non-film formation region EA to measure an actual width ΔT of the non-film formation region EA formed on the wafer W. In the film forming system 1 of the present example, the imaging unit 521 is provided at the aligner 12 for aligning the orientation of the wafer W to be processed in the process modules PM1 to PM8.

Hereinafter, the configuration of the aligner 12 and the imaging unit 521 provided near the aligner 12 will be described with reference to FIGS. 4 to 7C.

In the film forming system 1 of the present example, the aligner 12 has a function of detecting the position of the center $C_W$ of the wafer W and an orientation of a notch NC (cutout portion for identifying a crystal direction of the wafer W) seen from the center $C_W$. Based on the detection result, the orientation of the wafer W (orientation of the notch NC seen from the center $C_W$ of the wafer W) is adjusted by the aligner 12 and the transfer destination by the loader transfer unit 111 is adjusted. Accordingly, the orientation of the wafer W and the mounting position of the wafer W in the load-lock modules LL1 and LL2 can be aligned. As a result, the processing can be performed in a state where orientations and mounting positions of the wafers W in the process modules PM1 to PM8 which are transferred by the transfer units TR1 to TR4 are aligned.

As shown in FIG. 1, in the film forming system 1 of the present example, the aligner 12 is provided in the case provided at the side surface of the loader module 11. As can be seen from the side view of FIG. 4 and the top view of FIG. 5, the aligner 12 has a disc-shaped aligning table 43 on which the wafer W is mounted and a notch detection sensor 51. A rotational shaft 42 for rotating the aligning table 43 about a center of the aligning table 43 is connected to a central portion of a bottom surface of the aligning table 43. A driving unit 41 is provided at a lower end portion of the rotational shaft 42. By rotating the rotational shaft 42 about the vertical axis, the wafer W mounted on the aligning table 43 can be rotated.

The notch detection sensor 51 is configured as a transmission type sensor in which a light transmitting part 511 and a light receiving part 512 are disposed to face each other in a vertical direction with the edge portion of the wafer W mounted on the aligning table 43 interposed therebetween. The light transmitting part 511 has LEDs or the like arranged in a line shape in a diametrical direction of the aligning table 43. The light receiving part 512 has a CCD sensor or the like. A part of light outputted from the light transmitting part 511 is blocked by the edge portion of the wafer W mounted on the aligning table 43 and the remaining light is incident on the light receiving part 512. When the wafer W is rotated once by the aligning table 43, the amount of light detected by the light receiving part 512 is considerably increased at a position where the notch NC is formed. Therefore, the formation position of the notch NC can be recognized. When the formation position of the notch NC is recognized, the aligner 12 adjusts the orientation of the wafer W by rotating the aligning table 43 such that the notch NC is directed to a predetermined direction.

Further, the aligner 12 can recognize displacement of a position of an end of the wafer W by previously obtaining correlation between the position of the end of the wafer W which blocks a part of the light outputted from the light transmitting part 511 and the amount of light incident on the light receiving part 512. When the rotational center of the aligning table 43 and the center $C_W$ of the wafer W coincide with each other, the position of the end of the wafer W which is detected by the light receiving part 512 is not changed except the formation position of the notch NC (reference position). Therefore, the distance and the direction of the deviation of the center $C_W$ of the wafer W from the rotational center of the aligning table 43 can be specified by detecting the position of the notch NC and the displacement of the position of the end during single rotation of the wafer W and specifying the direction in which the displacement from the reference position is increased and the width of the displacement at that time.

Once the distance and the direction of the deviation of the center $C_W$ of the wafer W on the aligning table 43 are obtained, when the wafer W is received from the aligner 12 and transferred to the mounting places (not shown) in the load-lock modules LL1 and LL2 by the loader transfer unit 111, the transfer destination of the wafer W is shifted to offset the deviation. Accordingly, the wafers W whose orientations are aligned can be mounted on the accurate mounting positions of the mounting places.

Figure 4:
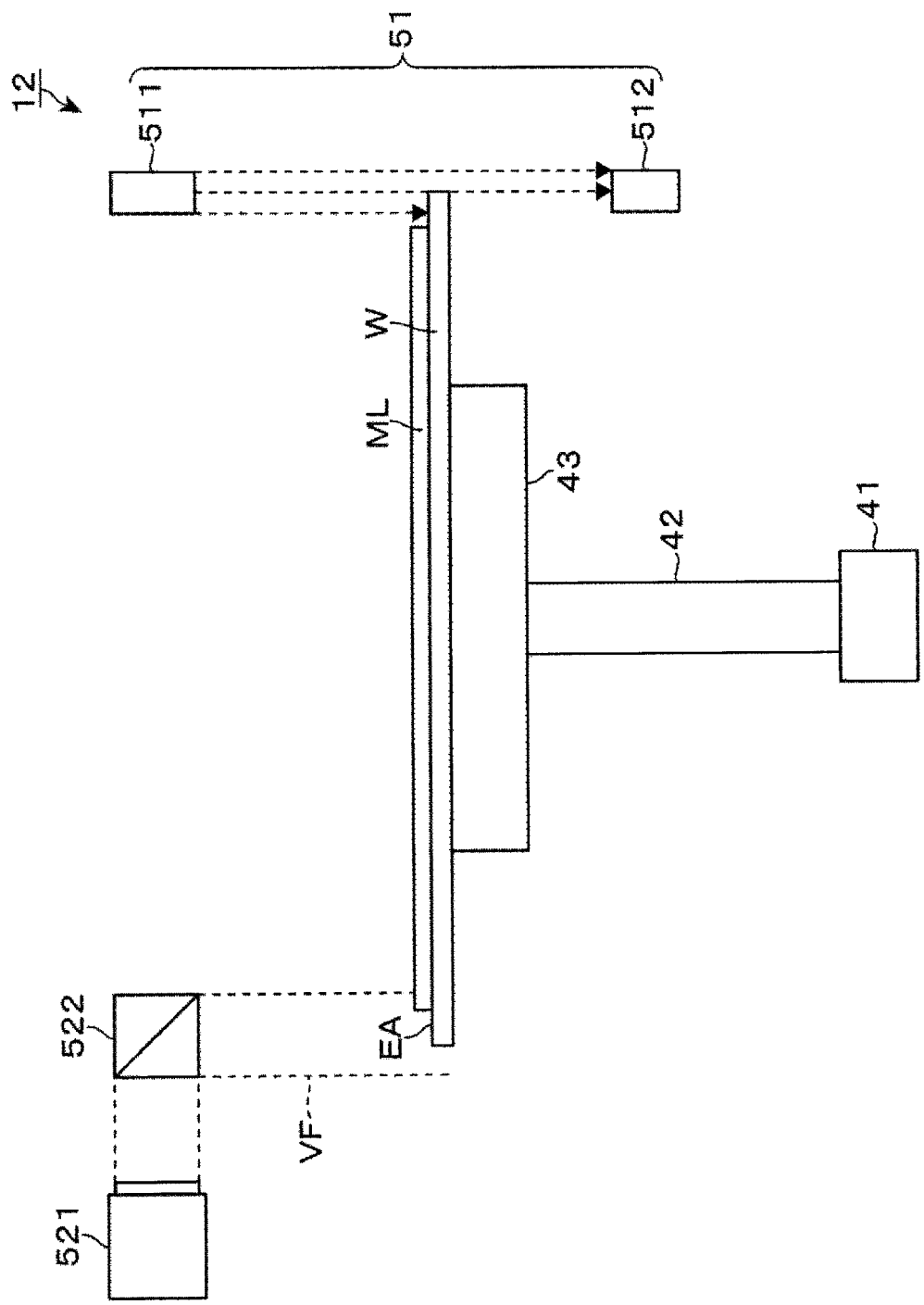
FIG. 4 is a side view of an aligner provided in the film forming system.
Figure 5:
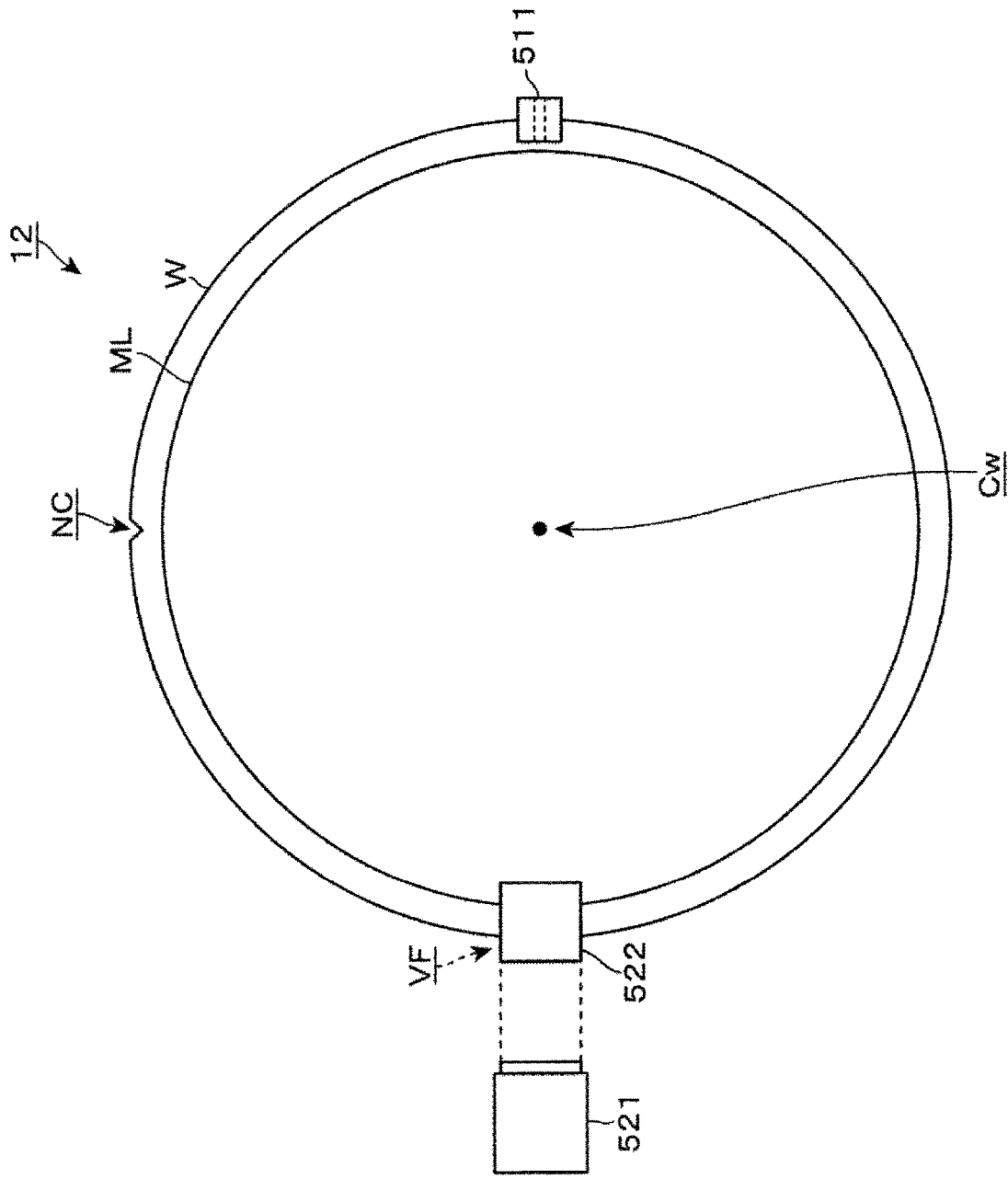
FIG. 5 is a top view of the aligner.

For convenience of illustration, FIGS. 4 and 5 illustrate a state in which the wafer W having the metal film ML after the film formation is mounted on the aligning table 43. However, the pre-alignment is performed before the wafer W unloaded from the FOUP 110 is transferred to the load-lock modules LL1 and LL2. Therefore, during the pre-alignment, the wafer W does not have on the surface thereof the metal film ML formed by the film forming system 1.

The aligner 12 is provided with the imaging unit 521. As shown in FIGS. 4 and 5, the imaging unit 521 has a visual field VF capable of capturing an image of the edge portion of the wafer W that has been subjected to the film formation and mounted on the aligning table 43. An image whose optical path is changed by a reflection mirror 522 is incident on the imaging unit 521 of the present example. The image data of the edge portion of the wafer W which includes the non-film formation region EA can be obtained by the imaging unit 521 (see FIG. 6). The imaging unit 521 is, e.g. a CCD camera.

Figure 6:
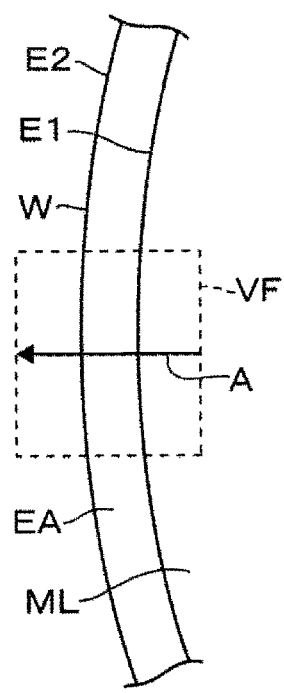
FIG. 6 is an enlarged top view showing an edge of a wafer that has been subjected to film formation.
Figure 7:
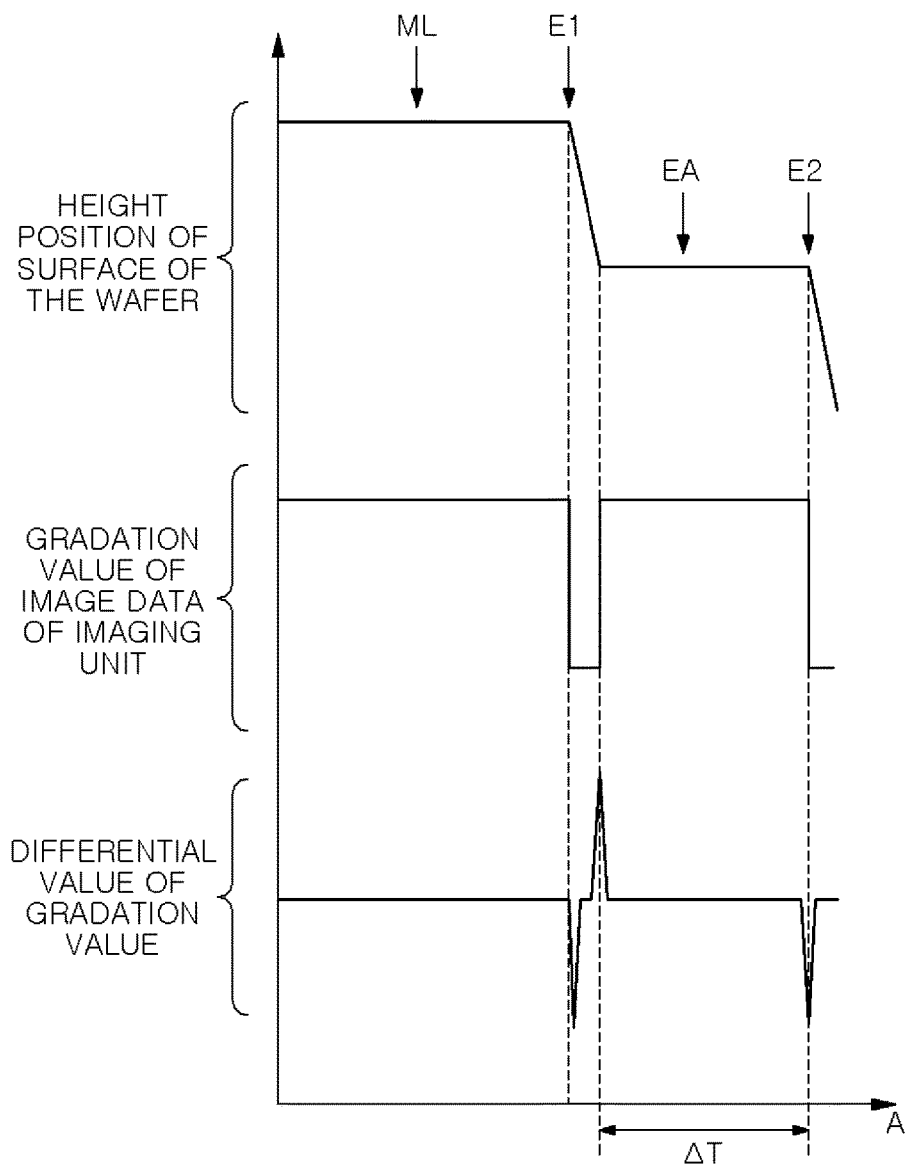
FIGS. 7A to 7C explain a method for distinguishing a film formation region and a non-film formation region formed at the wafer.

FIGS. 7A to 7C show distribution of a height position of the surface (top surface) of the wafer W within the view VF shown in FIG. 6, a gradation value of the image data obtained by the imaging unit 521, and a differential value of the gradation value along an arrow A set in a radial direction of the wafer W.

As shown in FIG. 7A, the surface of the wafer W having the metal film ML is highest at the film formation region where the flat metal film ML is formed and becomes gradually lower from the end E1 of the metal film ML toward the non-film formation region EA. A chamfered region referred to as a beveled region is formed at the end of the wafer W. The surface of the wafer W becomes gradually lower from an inner end E2 of the beveled region toward the outer side.

In the image data of the surface of the wafer W having the above-described height distribution, dark parts are formed at the inclined surface between the metal film ML and the non-film formation region EA and at the inclined surface of the beveled region, and the gradation value of the image data is decreased at the dark parts (see FIG. 7B). Thus, the differential value obtained by differentiating the gradation value along the direction of the arrow A has a peak at a start point or an end point of the inclined surface between the metal film ML and the non-film formation region EA and a position corresponding to the inner peripheral end of the beveled region (see FIG. 7C).

Accordingly, the actual width of the non-film formation region EA can be calculated by specifying positions of the end point (outer peripheral end of the metal film ML) of the inclined surface between the metal film ML and the non-film formation region EA and the start point of the beveled region (inner peripheral end of the beveled region) based on the position where the peaks are detected and obtaining a distance between those positions. The distance between the outer peripheral end of the metal film ML and the inner peripheral end of the beveled region can be calculated based on, e.g., the number of pixels in the image data between the positions where the peaks corresponding to the ends are detected.

As shown in FIG. 1, the film forming system 1 includes a control unit 7. The control unit 7 includes a computer having a CPU (Central Processing Unit) (not shown) and a storage unit. The storage unit stores a program having a group of steps (commands) for outputting a control signal for performing an operation of unloading a wafer W before film formation from the FOUP 110, transferring the wafer W to the process modules PM1 to PM8 and performing film formation or heat treatment on the wafer W and then returning the wafer W to the FOUP 110. The program is stored in a storage medium, e.g., a hard disk, a compact disk, a magneto-optical disk, a memory card or the like, and installed in the storage unit.

Next, an operation of performing film formation on the wafer W by using the film forming system 1 having the above-described configuration will be described.

The FOUP 110 accommodating wafers W before film formation is mounted on the mounting stage 112. When a door of the FOUP 110 is separated by an opening/closing mechanism (not shown) provided at the loader module 11, the wafers W are unloaded and transferred one by one to the aligner 12 by the loader transfer unit 111.

In the aligner 12, the pre-alignment described with reference to FIGS. 4 and 5 is performed on the wafer W. Then, the loader transfer unit 111 transfers the wafer W from the aligner 12 to one of the load-lock modules LL1 and LL2. In the present example, there will be described a case in which the load-lock module LL1 is used for loading the wafer W before film formation and the load-lock module LL2 is used for unloading the wafer W after the film formation.

By performing the pre-alignment, the orientation of the notch NC of the wafer W is aligned to a predetermined orientation and the position of the center $C_W$ of the wafer W is recognized. Accordingly, the wafer W can be mounted on the accurate mounting position of the mounting place in the load-lock module LL1 in a state where the notch NC is directed to the preset direction.

When the wafer W is transferred to the load-lock module LL1, the gate valve GVL1 is closed and the load-lock module LL1 is evacuated. When a pressure in the load-lock module LL1 becomes a predetermined vacuum level, the gate valve GV11 is opened and the wafer W is loaded into the vacuum transfer module TM1 by the transfer unit TR1. Then, the gate valve GV1 is closed.

Next, the gate valve GV13 is opened and the wafer W is loaded into the process module PM1.

In the process module PM1, the film forming apparatus 2 lowers the mounting table 23 to the delivery position and the wafer W is delivered from the end effector of the transfer unit TR1 to the mounting table 23 by elevating pins (not shown).

When the wafer W is delivered to the mounting table 23, the transfer unit TR1 retreats from the processing chamber 21 and the gate valve GV13 is closed.

The mounting table 23 on which the wafer W is mounted is lifted from the delivery position toward the processing position. During the lifting operation, the mask 26 supported by the supporting portion 281 is delivered to the mounting table 23 and the pins 233 of the mounting table 23 are inserted into the respective insertion holes 265 of the mask 26. Accordingly, the mask 26 is located at a predetermined arrangement position. When the mounting table 23 to which the mask 26 is delivered reaches the processing position, the lifting operation is stopped.

Thereafter, sputtering gas is supplied from the gas supply unit 29 into the processing chamber 21 and a pressure in the processing chamber 21 is controlled by performing evacuation. When the pressure in the processing chamber 21 becomes a predetermined level, the mounting table 23 is rotated and power is applied from the power supply 36 to the holder 30.

As a result, the gas supplied from the gas supply unit 29 is ionized. Ions collide with the target 34, thereby sputtering a material (e.g., metal atoms) of the metal film from the target 34.

The metal sputtered from the target 34 reaches the surface of the wafer W through the opening 262 of the mask 26 and is deposited on the surface of the wafer W. As a consequence, the metal film ML is formed.

When the above-described film formation is performed for a preset period of time and the metal film ML having a desired thickness is formed on the surface of the wafer W, the supply of power from the power supply 36 and the supply of gas from the gas supply unit 29 are stopped. The rotation of the mounting table 23 is stopped and the mounting table 23 is lowered from the processing position to the delivery position.

As described above, when the film formation on the wafer W in the film forming apparatus 2 of the process module PM1 is completed, the wafer W is transferred to the vacuum transfer module TM2 connected to the process module PM1. Then, the wafer W is loaded into the process module PM3 connected to the vacuum transfer module TM2 and the above-described operations are performed by the film forming apparatus 2. Accordingly, another metal film ML different from the metal film formed in the process module PM1 is formed on the surface of the wafer W.

By performing the film formation while transferring the wafer W to the process modules in the order of PM1→PM3→PM5→PM7→PM8, different (e.g., different types of) metal films ML are deposited sequentially. In this example, the heat treatment is performed in the process module PM6 after the film formation has been performed in the process module PM8. The wafer W is transferred to the load-lock module LL2 via the process modules PM4 and PM2 where the processing is not performed.

As described above, it is possible to appropriately change the number of the oxidation apparatuses, the heat treatment apparatuses and the film forming apparatuses set in the process modules PM1 to PM8 of the film forming system 1 of the present example depending on the composition of the films deposited on the wafer W. The path of the wafer W to be transferred to the process modules PM1 to PM8 can also be appropriately set depending on the corresponding relation between arrangement positions of various devices or types of metal films formed by the film forming apparatus and the composition of the films formed on the wafer W.

When the wafer W having the laminated metal films ML after the film formation is loaded into the load-lock module LL2 for unloading the wafer W, the gate valve GV12 is closed and, then, a pressure in the load-lock module LL2 is increased to an atmospheric pressure by introducing clean air into the load-lock module LL2. Next, the gate valve GVL2 is opened and the wafer W is unloaded from the load-lock module LL2 and transferred to the original FOUP 110 by the loader transfer unit 111.

When the above-described operations are performed on all the wafers W in the FOUP 110 and all the wafers W are accommodated in the FOUP 110 after the film formation, the separated door is attached to the FOUP 110 and the FOUP 110 is transferred to a next process.

The film forming system 1 for performing the film formation based on the above-described operations includes the imaging unit 521 for measuring an actual width $\Delta T$ of the non-film formation region EA formed at the wafer W based on the method described with reference to FIGS. 4 to 7C. The film forming system 1 of the present example has a function of specifying an actual arrangement position of the mask 26 based on the measurement result of the width $\Delta T$ which is obtained by using a test wafer W and correcting the mounting position of the wafer W on the mounting table 23 based on the actual arrangement position such that the width $\Delta T$ of the non-film formation region EA formed at the product wafer W transferred to the film forming apparatus 2 becomes a preset design value.

Hereinafter, the method for correcting the mounting position of the wafer W will be described with reference to FIGS. 8 and 9 to 17.

As described with reference to FIG. 9, the mask 26 has an expected arrangement position where the non-film formation region EA having the preset width $\Delta T$ can be formed when the film formation is performed on the wafer W mounted on a predetermined position (hereinafter, referred to as "first position") set on the mounting table 23. As shown in FIG. 9, the first position of the present example is set to a position where the position of the center $C_W$ of the wafer is aligned with the rotational center $C_R$ of the mounting table 23. The expected arrangement position of the mask 26 is set to a position where the position of the center $C_M$ of the opening 262 is aligned with the rotational center $C_R$ of the mounting table 23.

If the design width of the non-film formation region EA formed by using the mask 26 becomes smaller than, e.g., 1.0 mm or less, the end of the metal film ML may reach the beveled region of the wafer W even by slight deviation between the mask 26 to be located at the expected arrangement position and the wafer W mounted on the first position. As the deviation is smaller, it is more difficult to distinguish the outer peripheral end of the metal film ML and the inner peripheral end of the beveled region based on the image data of the edge portion of the wafer W which is described with reference to FIGS. 7A to 7C.

In that case, the actual arrangement position of the mask 26 cannot be specified even by capturing an image of the non-film formation region EA by using the imaging unit 521. Therefore, the film forming system 1 of the present example can perform the operation of specifying the actual arrangement position of the mask 26 by using the imaging unit 521 even when the design width of the non-film formation region EA is small.

When the design width of the non-film formation region EA is smaller than 0.2 mm, it is difficult to distinguish the outer peripheral end of the metal film ML and the inner peripheral end of the beveled region visually or by using the imaging unit 521. Therefore, this technique is more suitable for the case in which the width of the non-film formation region EA is smaller than 0.2 mm. However, it does not mean that this technique cannot be applied to the case in which the width of the non-film formation region EA is 0.2 mm or above.

The mounting position of the wafer W is corrected when the film forming system 1 is newly installed or after the mask 26 is exchanged in the film forming apparatus 2, for example. The test wafer W may be the same as the product wafer W.

First, the test wafer W is transferred by the transfer units (the loader transfer unit 111 and the transfer units TR1 to TR4) to the process modules PM1 to PM5, PM7 and PM8 including the film forming apparatus 2 where the mounting position is corrected. The wafer W is mounted at a second position on the mounting table 23 which is deviated from the first position corresponding to the expected arrangement position of the mask 26 (step PR1 of FIG. 8).

At this time, the test wafer W may be transferred to the process modules PM1 to PM5, PM7 and PM8 where the mounting position is corrected through the same transfer path as that used in the case of laminating the metal films ML on the product wafer W. By passing through the same transfer path as that of the product wafer W, the test wafer W can be transferred to the film forming apparatus 2 while reproducing positional deviation or the like at the time of delivering the wafer W by the transfer units TR1 to TR4 or the transfer unit 111 between the load-lock modules LL1 and LL2, and the process modules PM1 to PM8.

When the transfer units (the loader transfer unit 111 or the transfer units TR1 to TR4) are controlled such that the wafer W can be mounted on the same position (the first position) regardless of types of the transfer paths, the test wafer W may be transferred through a shortest transfer path instead of the transfer path of the product wafer W.

The second position where the test wafer W is mounted is set to be deviated from the first position corresponding to the expected arrangement position of the mask by a preset distance in a preset direction.

The deviated direction of the second position from the first position is not particularly limited. When the notch NC is formed in the corresponding deviated direction, an operation of estimating the width of the non-film formation region EA formed at the region corresponding to the notch NC which is performed on the assumption that the notch NC is not formed is carried out by a method to be described later with reference to FIG. 18.

The deviated distance of the second position from the first position is set to be the same as the design width of the non-film formation region EA and preferably set to be greater than the design width of the non-film formation region EA by twice or more (distance of at least 1.0 mm and preferably 2.0 mm or above when the design width of the non-film formation region EA is 1.0 mm) within a range that the side surface of the wafer W is prevented from being in contact with the shield plate 234 or the protrusion 264 of the mask 26.

As described above, when the distance from the outer peripheral end of the metal film ML and the inner peripheral end of the beveled region is smaller than 0.2 mm, it is difficult to distinguish those ends. Therefore, it is preferable to set the distance between the first position and the second position to be 0.2 mm or more so that the ends can be distinguished even when the design width of the non-film formation region EA is smaller than 0.2 mm.

As a result of the film formation performed in a state where the wafer W is mounted on the second position, even it is still difficult to distinguish the outer peripheral end of the metal film ML and the inner peripheral end of the beveled region by using the imaging unit 521 in a subsequent step of measuring the width of the non-film formation region EA, a new test wafer W may be transferred to a second position that is reset by increasing the deviated distance.

When the test wafer W is mounted on the second position set on the mounting table 23, the mounting table 23 is lifted from the delivery position to the processing position and the mask 26 is positioned above the wafer W. Then, the process of forming the metal film ML on the wafer W is performed in the above-described sequence (step PR2).

Upon completion of the film formation, the wafer W is unloaded from the film forming apparatus 2 and transferred to the aligner 12, and the width ΔT of the non-film formation region EA is measured by the imaging unit 521 (step PR3).

Next, an actual arrangement position of the mask 26 is specified based on the measurement result of the width ΔT of the non-film formation region EA and the direction and the distance of the deviation of the second position on which the test wafer W is mounted from the first position during the film formation (step PR4).

When the actual arrangement position of the mask 26 is specified in the step PR4, a plurality of methods can be employed. A specific example thereof will be described with reference to FIGS. 11 to 17.

First, in a state where the wafer W is mounted on the first position (where the rotational center $C_R$ of the mounting table 23 and the center $C_W$ of the wafer W are aligned) described with reference to FIG. 9, the actual arrangement position of the mask 26 is made to be deviated from the expected arrangement position (where the center $C_M$ of the circle of the opening 262 is aligned with the rotational center $C_R$ of the mounting table 23) as can be seen from FIG. 10.

For convenience of illustration, in FIGS. 9 to 14 and 15 to 17, only circles corresponding to the opening 262 of the mask 26 are illustrated.

In that case, in a first method, two second positions are set in the X-axis and the Y-axis in the drawing and film formation is performed on different test wafers W mounted on the second positions. The actual arrangement position of the mask 26 is specified based on the result thereof (see FIGS. 11 to 14). For convenience of calculation, the X-axis and the Y-axis are set in such a manner that a direction of movement toward the second position which is seen from the first position with the rotational center $C_R$ of the mounting table 23 as the origin become positive (+).

Figure 11:
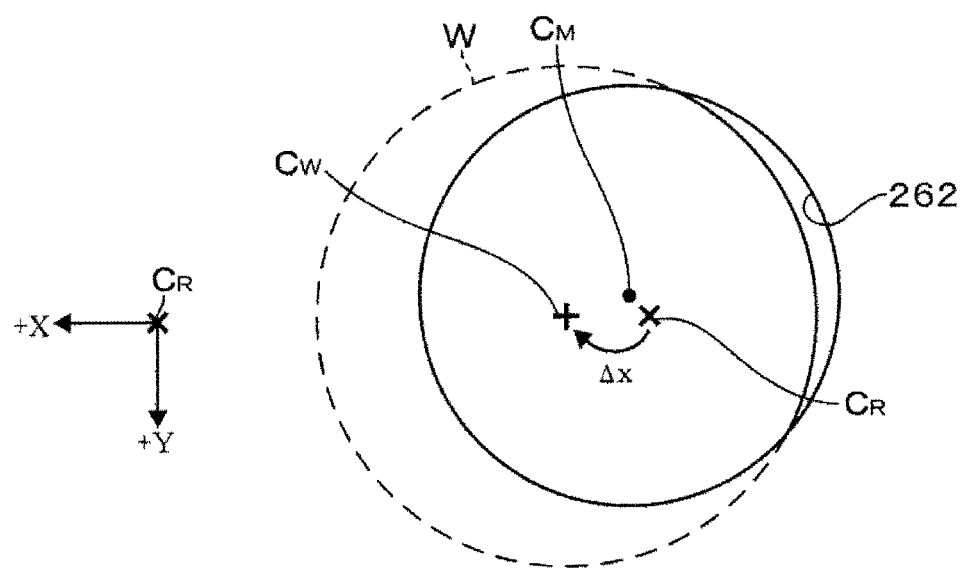
FIG. 11 is a first top view showing arrangement of a test wafer based on a first method.
Figure 12:
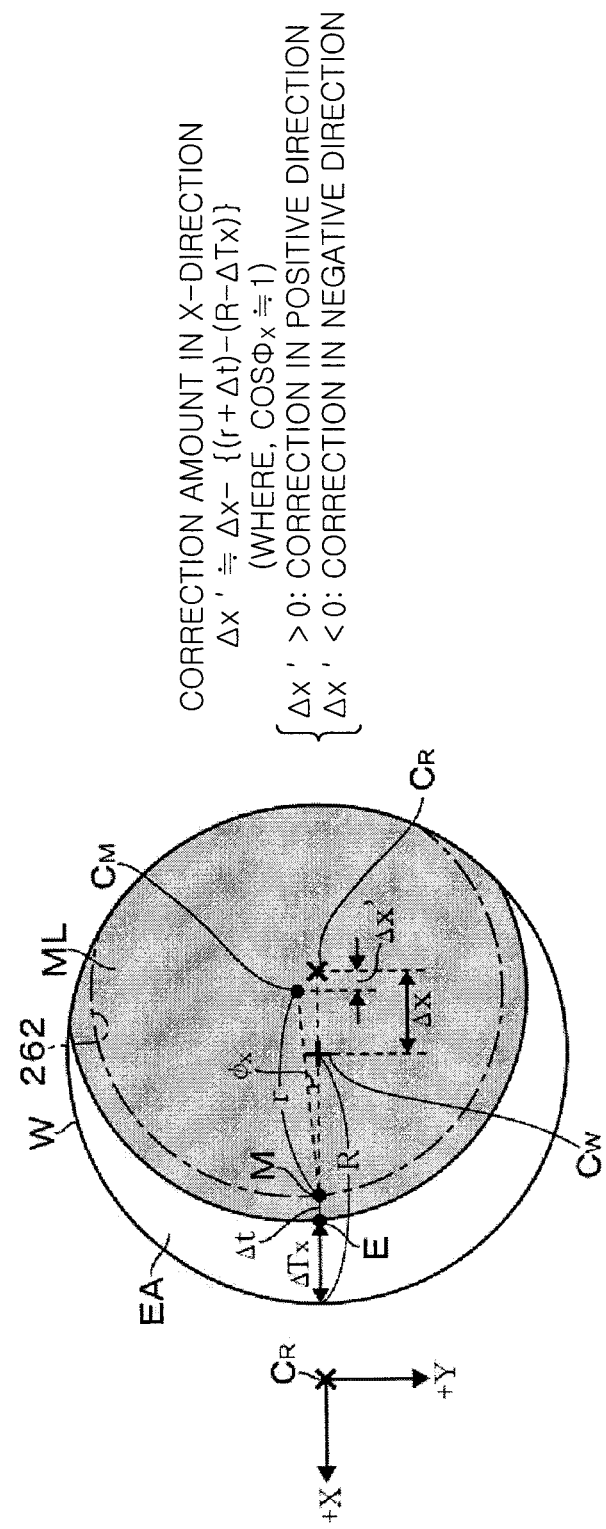
FIG. 12 is the first top view showing the test wafer after film formation in the state shown in FIG. 11.

FIG. 11 shows a state in which the test wafer W is mounted on the second position set to a position shifted from the state shown in FIG. 10 by a distance Δx in the positive direction of the X-axis. If the film formation is performed in that state, the wafer W on which the metal film ML and the non-film formation region EA are formed as shown in FIG. 12 is obtained. The material of the metal film ML which is sputtered from the target 34 reaches a region under the mask 26 to form the metal film ML. On the assumption that a radius of the opening 262 (indicated by a dashed-dotted line in FIG. 12; this holds true in FIGS. 14, 16 and 17) is r and a width of the surrounded portion is Δt, the metal film ML having a radius r+Δt is formed on the surface of the wafer W after the film formation. In FIGS. 12, 14, 16, 17 and 18 showing the wafer W after the film formation, gray regions represent the metal films ML and white regions represent the non-film formation regions EA.

The mask 26 is configured to be located at the preset expected arrangement position by inserting the pins 233 of the mounting table 23 into the insertion holes 265. It is considered that the actual arrangement position of the mask 26 is deviated from the expected arrangement position because deviation beyond an allowable limit occurs due to combination of the effect of the gap between the pins 233 and the insertion holes 265 and the effect of manufacturing or assembling errors.

When the deviation becomes apparent due to combined causes of slight deviation, the amount of variation Δx' in the X-axis direction of the actual arrangement position of the mask 26 with respect to the expected arrangement position is sufficiently small compared to the radius r of the opening 262. Therefore, an angle $\varphi_X$ of $\angle C_M M C_R$ in the case of setting the intersection point between the X-axis extending in the positive direction and the opening 262 (indicated by a dashed dotted line) drawn on the wafer W to M is sufficiently small, and it is considered that the condition cos $\Phi_X \approx 1$ is satisfied. At this time, a distance $|C_W E|$ on the X-axis from the center $C_W$ of the wafer W to the end E of the metal film ML can be expressed by the following Eq. (1).

$$|C_W E| = r \cos \varphi_X - (\Delta x - \Delta x') + \Delta t \approx r - (\Delta x - \Delta x') + \Delta t \quad \text{Eq. (1)}$$

On the assumption that the radius of the wafer W is R and the width of the non-film formation region EA at the intersection position between the non-film formation region EA and the X-axis that is the deviated direction of the second position from the first position which is obtained by the imaging unit 521 is $\Delta T_X$, the distance $|C_W E|$ is expressed by the following Eq. (2).

$$|C_W E| = R - \Delta T_X \quad \text{Eq. (2)}$$

By developing the Eqs. (1) and (2) for the amount of variation Δx' in the X-axis direction, the following Eq. (3) is obtained.

$$\Delta x' = \Delta x - \{(r + \Delta t) - (R - \Delta T_X)\} \quad \text{Eq. (3)}$$

When the condition Δx'>0 is satisfied from the relation between the center $C_W$ of the wafer W located at the first position shown in FIG. 10 and the actual arrangement position $C_M$ of the mask 26, the wafer W located at the first position is made to be deviated by |Δx'| in the positive direction. Accordingly, the deviation in the X-axis direction from the center $C_M$ of the mask 26 can be offset. When the condition Δx'<0 is satisfied, the wafer W is made to be deviated by |Δx'| in the negative (−) direction. Accordingly, the deviation in the X-axis direction can be offset.

Figure 13:
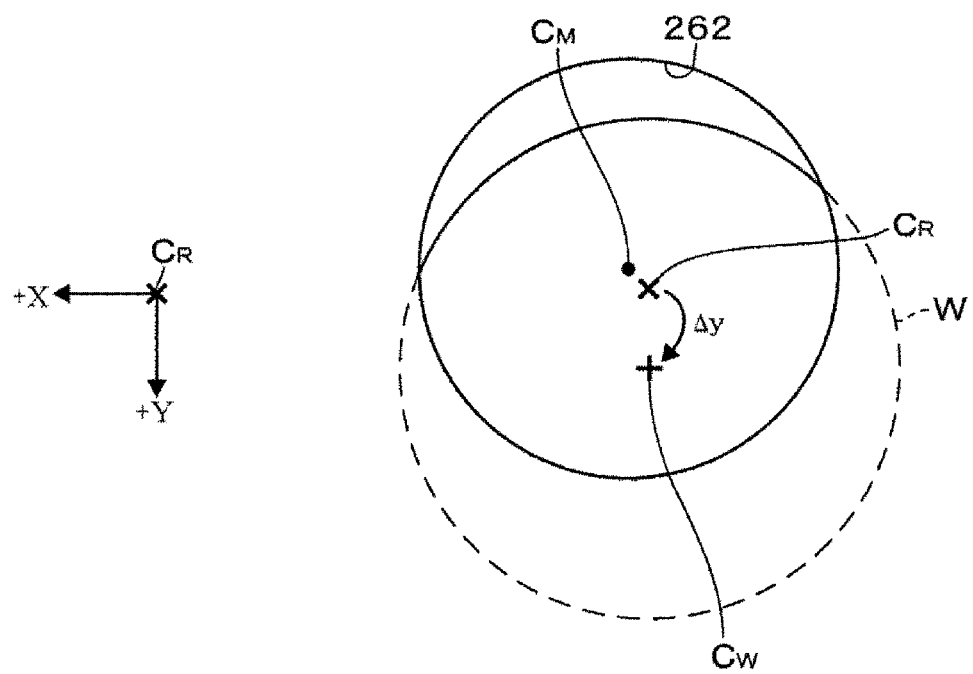
FIG. 13 is a second top view showing arrangement of the test wafer based on the first method.
Figure 14:
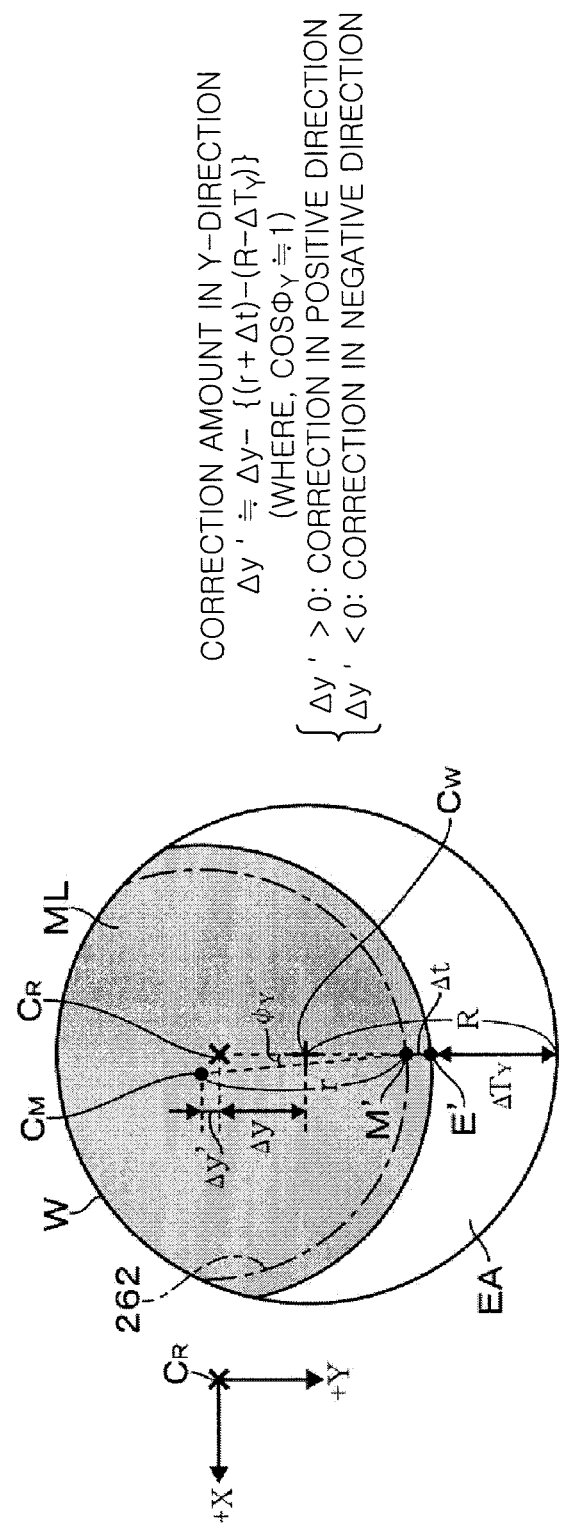
FIG. 14 is the second top view showing the test wafer after the film formation in the state shown in FIG. 13.

FIG. 13 shows a state in which the test wafer W is mounted on a second position set to a position shifted from the state shown in FIG. 10 by a distance Δy in the positive direction of the Y-axis. When the film formation is performed in that state, the wafer W having the metal film ML and the non-film formation region EA as shown in FIG. 14 is obtained.

In the case of setting an intersection point between the Y-axis extending in the positive direction and the opening 262 (indicated by a dashed dotted line) drawn on the wafer W to M', a distance $|C_W E'|$ on the Y-axis from the center $C_W$ of the wafer W to the end E' of the metal film ML can be expressed by the following Eqs. (4) and (5) based on the same method as that used in the example shown in FIG. 12.

$$|C_W E'| = r \cos \varphi_Y - (\Delta y - \Delta y') + \Delta t \approx r - (\Delta y - \Delta y') + \Delta t \quad \text{Eq. (4)}$$

$$|C_W E'| = R - \Delta T_Y \quad \text{Eq. (5)}$$

By developing the Eqs. (4) and (5) for the amount of variation Δy' in the Y-axis direction, a following Eq. (6) is obtained.

$$\Delta y' = \Delta y - \{(r + \Delta t) - (R - \Delta T_Y)\} \quad \text{Eq. (6)}$$

When the condition Δy'>0 is satisfied from the relation between the center $C_W$ of the wafer W located at the first position shown in FIG. 10 and the actual arrangement position $C_M$ of the mask 26, the wafer W located at the first position is made to be deviated by |Δy'| in the positive direction. Accordingly, the deviation in the Y-axis direction from the center $C_M$ of the mask 26 can be offset. When the condition Δy'<0 is satisfied, the wafer W is made to be deviated by |Δy'| in the negative (−) direction. Accordingly, the deviation in the Y-axis direction can be offset.

Figure 15:
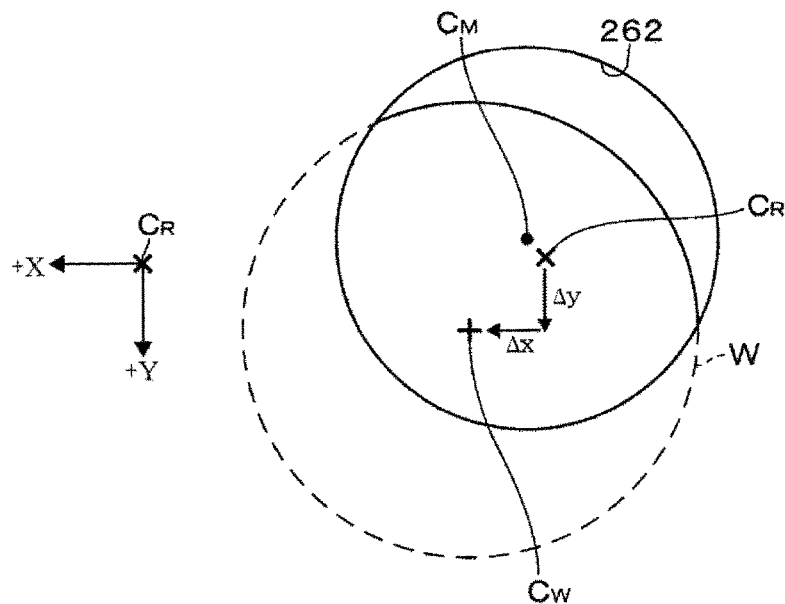
FIG. 15 is a top view showing arrangement of the test wafer based on a second method.
Figure 16:
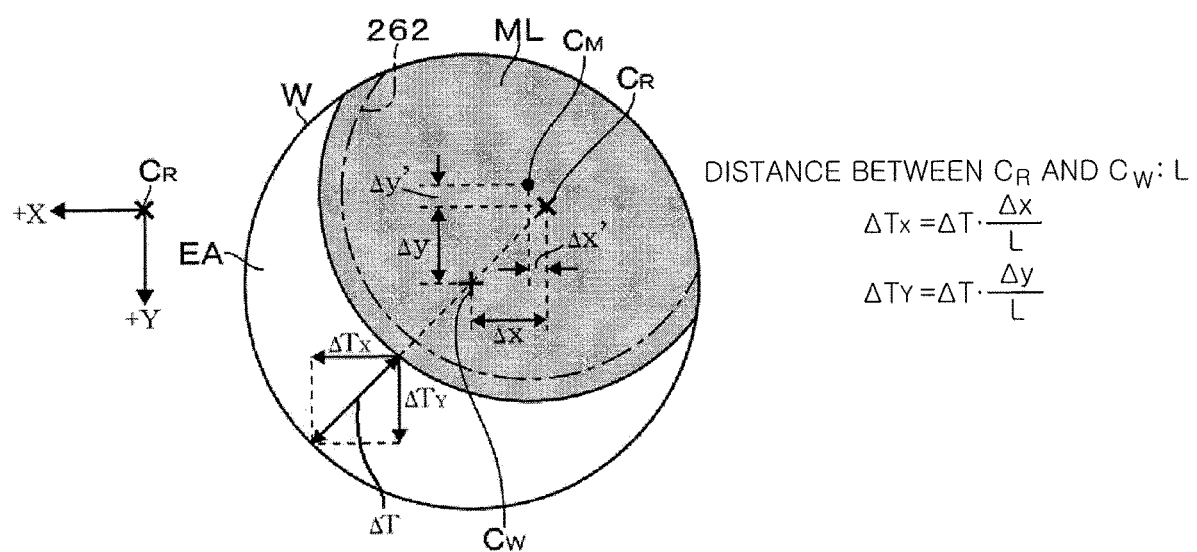
FIG. 16 is a top view showing the test wafer after the film formation in the state shown in FIG. 15.

Next, a second method will be described. FIG. 15 shows a state in which the test wafer W is mounted on the second position set to a position shifted in an inclined direction by combining the movement of the distance Δx in the positive direction of the X-axis shown in FIG. 11 and the movement of the distance Δy in the positive direction of the Y-axis shown in FIG. 13. If the film formation is performed in that state, the wafer W having the metal film ML and the non-film formation region EQ as shown in FIG. 16 is obtained.

In the case of setting a distance between the first position and the second position shifted in the inclined direction to L and the width of the intersection position where the inclined direction (the deviated direction of the second position from the first position) and the non-film formation region EA intersect with each other when seen from the center $C_W$ of the wafer W to ΔT, an X-axis component $\Delta T_X$ and a Y-axis component $\Delta T_Y$ of the corresponding width can be expressed by the following Eqs. (7) and (8).

$$\Delta T_X = \Delta T \cdot (\Delta x / L) \quad \text{Eq. (7)}$$

$$\Delta T_Y = \Delta T \cdot (\Delta y / L) \quad \text{Eq. (8)}$$

By inputting the X-axis component $\Delta T_X$ and the Y-axis component $\Delta T_Y$ of the width ΔT of the non-film formation region EA into the Eqs. (3) and (6), the correction amounts Δx' and Δy' of the first position can be obtained.

Figure 17:
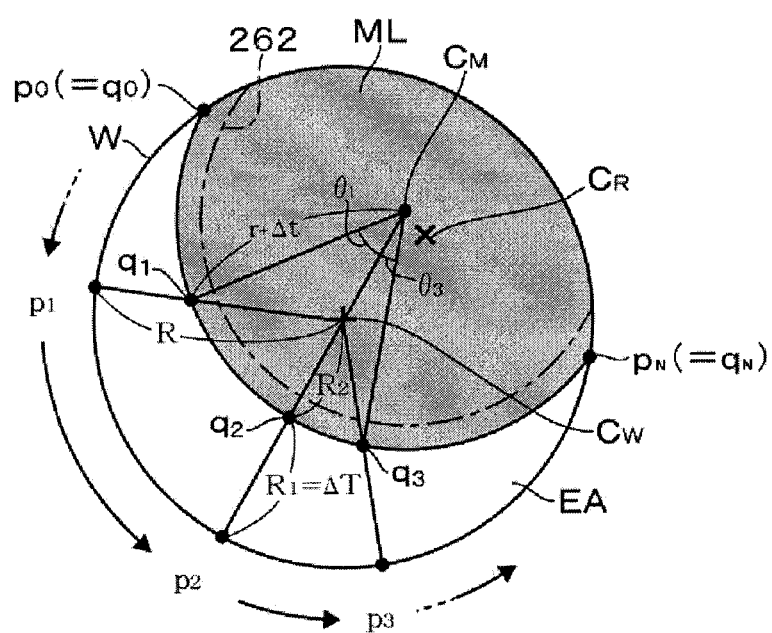
FIG. 17 is a top view showing the test wafer after the film formation in the state shown in FIG. 15 based on a third method.

FIG. 17 explains a third method. In the present example, the second position is set in a preset direction (FIG. 17 shows the case of performing film formation at the second position shifted by the same distance as that in FIG. 15 and in the same direction as that in FIG. 15).

In the example shown in FIG. 17, an outer edge $p_n$ of the radius R drawn from the center $C_W$ of the wafer W toward an outer periphery of the wafer W is moved from one intersection point $p_0$ between the outer periphery of the metal film ML and the outer periphery of the wafer W toward another intersection point $p_N$. At this time, the outer edge pn is shifted in the order of $p_0 \ldots \rightarrow p_1 \ldots \rightarrow p_2 \ldots \rightarrow p_3 \ldots \rightarrow p_N$, as can be seen from FIG. 17. An intersection point between the radius R and the outer periphery of the metal film ML is set to qn. The intersection point $q_n$ is moved in the order of $q_0 \ldots \rightarrow q_1 \ldots \rightarrow q_2 \ldots \rightarrow q_3 \ldots \rightarrow q_N$ by the movement of the outer edge $p_n$.

When the condition $\angle q n C_M C_W = \theta n$ is satisfied, the condition $|C_W q n| = R2$ can be expressed by the following Eq. (9).

$$R_2^2 = |C_M q n|^2 + |C_M C_W|^2 - 2|C_M q n||C_M C_W|\cos \theta n = (r + \Delta t)^2 + a^2 - 2a(r + \Delta t)\cos \theta n \quad \text{Eq. (9)}$$

At this time, the conditions $|C_M C_W| = a$ and $\theta n \neq 0$ are satisfied.

Referring to the Eq. (9) and FIG. 17, $R_2^2$ becomes smaller as θn becomes close to zero. $R_2^2$ becomes minimum when the center $C_M$ of the mask 26, the center $C_W$ of the wafer W and the outer edge pn are arranged on a straight line (when the condition $p_n = p_2$ is satisfied in FIG. 17). When the distance between the outer edge pn on the radius and the intersection point qn is equal to $R_1$, $R_1$ becomes maximum at the position where $R_2^2$ becomes minimum. At this time, $R_1$ is not different from the width ΔT of the non-film formation region EA and, thus, the width ΔT of the non-film formation region EA becomes maximum at the position where the points $C_M$-$C_W$-$p_n$ are arranged on a straight line.

Based on the above-described relation, the width ΔT of the non-film formation region EA at different positions along the circumferential direction of the wafer W is continuously measured while rotating the wafer W mounted on the aligning table 43 shown in FIG. 4 and the position where the width ΔT becomes maximum (the outer edge $p_2$ in FIG. 17) is specified. By obtaining the intersection point $q_2$ between the straight line drawn from the outer edge $p_2$ in the radial direction of the wafer W and the outer periphery of the metal film ML, it is possible to specify the actual arrangement position (the center $C_M$ of the opening 262) of the mask 26 at a position shifted from the intersection point $q_2$ by the distance r+Δt in the radial direction. When the actual arrangement position of the mask 26 is specified, the first position may be corrected such that the position of the center $C_W$ of the wafer W is aligned with the actual arrangement position of the center $C_M$ of the opening 262.

Figure 18:
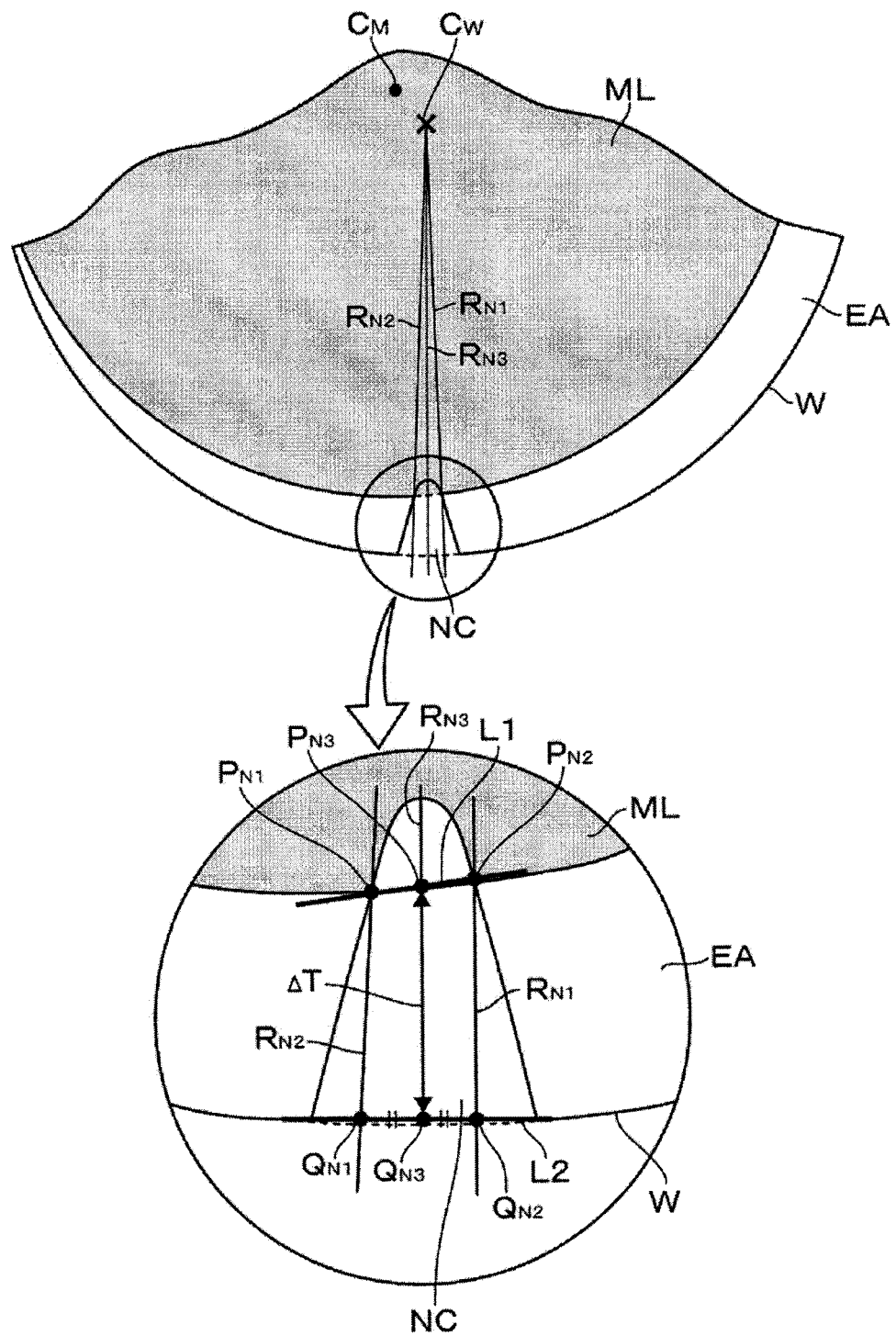
FIG. 18 is an enlarged view of a notch formation region of the wafer.

FIG. 18 shows an example in which the notch NC is formed in the deviated direction of the second position which is shown in FIGS. 11, 13 and 15 when seen from the center $C_W$ of the test wafer W. In that case, an operation of estimating the width ΔT of the non-film formation region EA formed at the region corresponding to the notch NC which is performed on the assumption that the notch NC is not formed is carried out.

While several methods for specifying the actual arrangement position of the mask 26 have been described with reference to FIGS. 11 to 17, the actual arrangement position of the mask 26 may be specified by another method.

The method for estimating the width ΔT of the non-film formation region EA is not particularly limited. For example, when the width of the notch NC is sufficiently small compared to the radius of the wafer W, it is assumed that a straight line connecting the intersection points $P_{N1}$ and $P_{N2}$ of the notch NC and the metal film ML is set to L1; radiuses connecting the center $C_W$ of the wafer W and the intersection points $P_{N1}$ and $P_{N2}$ are set to $R_{N1}$ and $R_{N2}$; a straight line connecting both ends of the notch NC is set to L2; intersection points between the straight line L2 and the radiuses $R_{N1}$ and $R_{N2}$ are set to $Q_{N1}$ and $Q_{N2}$; a radius drawn in the deviated direction of the second position seen from the first position (the direction in which a middle point $Q_{N3}$ of a segment $Q_{N1}$-$Q_{N2}$ is located in the example shown in FIG. 18) is set to $R_{N3}$; and an intersection point between the radius $R_{N3}$ and the straight line L1 is set to $P_{N3}$. At this time, the width ΔT of the non-film formation region EA formed at the corresponding region in the case of assuming that the notch NC is not formed may be approximated as a length of a segment $Q_{N3}$-$P_{N3}$.

Instead of the approximation, the position of the center of the metal film ML (i.e., the position of the center $C_M$ of the opening 262 of the mask 26) may be specified from the intersection point of straight lines drawn in directions perpendicular to a curved line of the end of the metal film ML formed within a visual field of an image of two different points in a circumferential direction of a region where the notch NC of the test wafer W is not formed which is captured by the imaging unit 521. By drawing a curved line of a circle having a radius r+Δt about the position of the center $C_M$, it is possible to estimate a curved line of the outer peripheral end of the metal film ML formed in a region corresponding to the notch NC in the case of assuming that the notch NC is not formed. Further, by drawing a circle having a radius R from the center of the wafer W, a curved line of the outer peripheral end of the wafer W can also be estimated. The width of the non-film formation region EA may be measured more accurately based on the distance between the intersection points between the straight line drawn in the deviated direction of the second position seen from the first position and the curved lines drawn by the outer peripheral end of the metal ML and the outer peripheral end of the wafer W.

On the assumption that the notch NC is not formed, if the width ΔT of the non-film formation region EA formed at the region corresponding to the notch NC can be estimated, the correction amount of the first position of the wafer W mounted on the mounting table 23 can be calculated by using the first to the third method described with reference to FIGS. 9 to 17.

Instead of the above-described methods, it is also possible to set the deviated direction of the second position to avoid a range connecting the center of the test wafer W and the region where the notch NC is formed.

Referring back to FIG. 8, when the actual arrangement position of the mask 26 is specified by the above-described method or the like, the first position that is the transfer destination of the transfer units TR1 to TR4 is corrected such that the center $C_M$ of the opening 262 in the actual arrangement position is aligned with the center $C_W$ of the product wafer W (step PR5).

Figure 8:
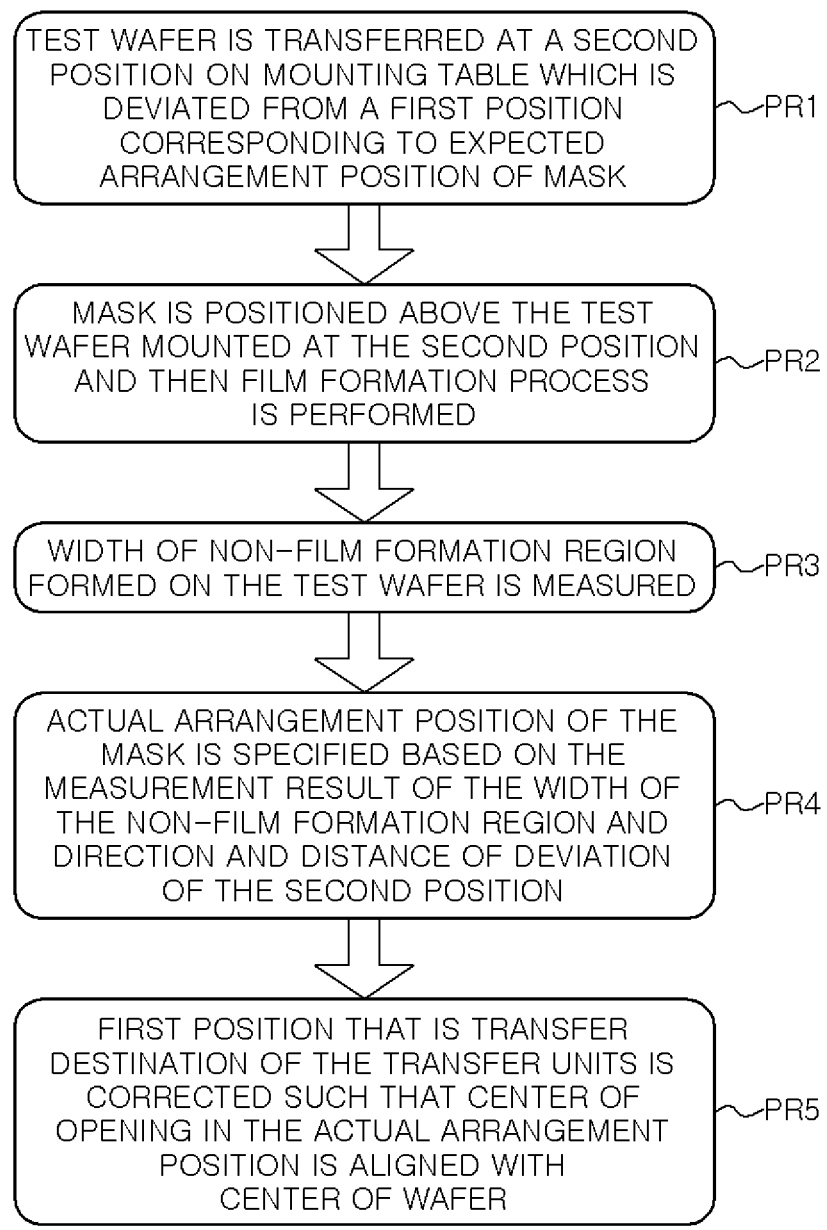
FIG. 8 explains a sequence of setting a mounting position of a wafer to be processed.

In the film forming apparatuses 2 provided in other process modules PM1 to PM5, PM7 and PM8 where the correction of the mounting positions is required, there preparation for the processing of the product wafer W is completed by performing the steps PR1 to PR5 shown in FIG. 8.

The film forming system 1 of the present embodiment provides the following effects. The actual arrangement position of the mask 26 is specified by allowing the film forming apparatus 2 for forming the non-film formation region EA on the wafer W by using the mask 26 to perform the film formation while intentionally deviating the mounting position (the second position) of the test wafer W from the actual mounting position (the first position). Therefore, even when the width of the non-film formation region is small, it is easy to distinguish the outer peripheral end of the metal film ML and the inner peripheral end of the beveled region of the wafer W, which makes it possible to accurately specify the actual arrangement position of the mask 26. As a result, the mounting position (the first position) of the product wafer W can be specified based on the actual arrangement position of the mask 26 and, thus, the metal film ML and the non-film formation region EA can be formed on the correct positions on the product wafer W.

In the step PR3 shown in FIG. 8, the width ΔT of the non-film formation region EA is not necessarily measured by the method for specifying the width ΔT based on the image data obtained by capturing the image of the edge portion of the wafer W by using the imaging unit 521. For example, it is also possible to unload the test wafer W that has been subjected to the film formation from the film forming system 1 and measure the width ΔT of the non-film formation region EA with naked eyes by using a caliper or the like.

The imaging unit 521 is not necessarily provided at the aligner 12 and may be provided at another position. For example, the imaging unit 521 may be provided at the cover 212 of the film forming apparatus 2 forming each of the process modules PM1 to PM5, PM7 and PM8. Or, a mounting table that is rotatable about a vertical axis as in FIG. 4 may be provided at the sidewall of the loader module 11 which is opposite to the side where the aligner 12 is provided and an imaging unit 521 for obtaining an image data of the edge portion of the wafer W rotated by using the mounting table.

The film forming apparatus 2 is not necessarily configured as a sputtering apparatus. For example, the present disclosure may be applied to a film forming apparatus for performing film formation by CVD (Chemical Vapor Deposition).

The configuration of the film forming system 1 is not limited to that shown in FIG. 1 in which a plurality of vacuum transfer modules TM1 to TM4 is connected through the process modules PM1 to PM6. For example, the present disclosure may also be applied to a cluster tool-type film forming system 1 in which a plurality of process modules PM1 to PM3 is connected in parallel to a single vacuum transfer module TM1.

The target substrate is not limited to a circular wafer W and may be a quadrangular substrate for use in FPD (Flat Panel Display). In the case of performing the film formation on a quadrangular substrate, the opening 262 of the mask 26 has a quadrangular shape.

The cutout portion for identifying an orientation which is formed at the circular wafer W is not limited to a wedge-shaped notch NC and may also be, e.g., an orientation flat.

While the disclosure has been shown and described with respect to the embodiments, it will be understood by those skilled in the art that various changes and modifications may be made without departing from the scope of the disclosure as defined in the following claims.

What is claimed is:

1. A method for setting a mounting position of a target substrate transferred by a substrate transfer unit on a mounting table in a processing chamber of a film forming apparatus, wherein the film forming apparatus includes a ring-shaped mask which covers a surface of an edge portion of the target substrate mounted on the mounting table and subjected to film formation to form a non-film formation region at the edge portion and has an opening corresponding to a film formation region formed at an inner side of the non-film formation region, the mask having an expected arrangement position where the non-film formation region has a preset width when the target substrate is mounted at a first position on the mounting table and subjected to the film formation, the method comprising:
 transferring a test substrate by the substrate transfer unit to a second position on the mounting table which is set to be deviated from the first position by a preset distance in a preset direction;
 performing the film formation on the test substrate mounted at the second position by using the mask;
 measuring a width of the non-film formation region formed on the test substrate after the film formation;
 specifying an actual arrangement position of the mask based on the direction and the distance of the deviation of the second position from the first position and the measured width of the non-film formation region formed on the test substrate; and
 correcting the first position as the mounting position of the target substrate based on the actual arrangement position of the mask and a cutout portion for identifying an orientation of the target substrate formed at the edge portion such that a center of the opening of the mask in the actual arrangement position is aligned with a center of the target substrate mounted on the first position and the non-film formation region has the preset width.

2. The method of claim 1, wherein the target substrate is a circular substrate,
 the opening of the mask is a circular opening, and
 the expected arrangement position of the mask is set to a position where the center of the target substrate mounted on the first position is aligned with the center of the opening of the mask.

3. The method of claim 1, wherein the target substrate is a circular substrate, and
 the direction of the deviation of the second position from the first position is set to avoid a range connecting the center of the target substrate and a region where the cutout portion is formed.

4. The method of claim 1, wherein the target substrate is a circular substrate,
 the cutout portion is notched,
 the direction of the deviation of the second position from the first position is set to a direction in which the notched cutout portion is formed when seen from the center of the target substrate, and
 in said measuring the width of the non-film formation region, the width of the non-film formation region formed at a region corresponding to the notched cutout portion is estimated based on a straight line between points where the notched cutout portion interests the edge of the film formation region.

5. The method of claim 1, wherein the target substrate is a circular substrate, and the opening of the mask is a circular opening,
 wherein in said measuring the width of the non-film formation region, the width of the non-film formation region at an intersection position where the direction of the deviation of the second position from the first position intersects with the non-film formation region is measured, and
 wherein in said specifying the actual arrangement position of the mask, the actual arrangement position is specified by using the width of the non-film formation region at the intersection position.

6. The method of claim 1, wherein the target substrate is a circular substrate, and the opening of the mask is a circular opening,
 wherein in said measuring the width of the non-film formation region, a position where the width of the non-film formation region becomes maximum is specified by measuring widths of the non-film formation region at different positions along a circumferential direction of the target substrate, and
 wherein in said specifying the actual arrangement position of the mask, the actual arrangement position is specified by using the result of specifying the position where the width of the non-film formation region becomes maximum.

7. The method of claim 1, wherein the distance of deviation of the second position from the first position is 0.2 mm or above.

8. The method of claim 1, wherein in said measuring the width of the non-film formation region, the width is specified based on image data obtained by capturing an image of the non-film formation region.

9. A film forming system comprising:
 a film forming apparatus having a mounting table in a processing chamber; and
 a substrate transfer unit configured to transfer a target substrate to a mounting position set on the mounting table, wherein the film forming apparatus includes:
a ring-shaped mask which covers a surface of an edge portion of the target substrate mounted on the mounting table and subjected to film formation to form a non-film formation region at the edge portion and has an opening corresponding to a film formation region formed at an inner side of the non-film formation region, the mask having an expected arrangement position where the non-film formation region has a preset width when the target substrate is mounted at a first position on the mounting table and subjected to the film formation; and
a control unit configured to output a control signal for executing: transferring a test substrate by the substrate transfer unit to a second position on the mounting table which is set to be deviated from the first position by a preset distance in a preset direction; performing the film formation on the test substrate mounted at the second position by using the mask; measuring a width of the non-film formation region formed on the test substrate after the film formation; specifying an actual arrangement position of the mask based on the direction and the distance of the deviation of the second position from the first position and the measured width of the non-film formation region formed on the test substrate; and correcting the first position as the mounting position of the target substrate based on the actual arrangement position of the mask and a cutout portion for identifying an orientation of the target substrate formed at the edge portion such that a center of the opening of the mask in the actual arrangement position is aligned with a center of the target substrate mounted on the first position and the non-film formation region has the preset width.

10. The film forming system of claim 9, wherein the film forming apparatus includes a rotation driving unit configured to rotate the mounting table about a vertical axis during the film formation, and
the mask is configured to be rotated together with the mounting table.

* * * * *